US012696385B2

(12) United States Patent
Ishii

(10) Patent No.: US 12,696,385 B2
(45) Date of Patent: Jul. 28, 2026

(54) WIRING BOARD AND MANUFACTURING METHOD THEREFOR

(71) Applicant: TOPPAN Holdings Inc., Tokyo (JP)

(72) Inventor: Tomoyuki Ishii, Tokyo (JP)

(73) Assignee: TOPPAN HOLDINGS INC., Tokyo (JP)

( * ) Notice: Subject to any disclaimer, the term of this patent is extended or adjusted under 35 U.S.C. 154(b) by 183 days.

(21) Appl. No.: 18/639,407

(22) Filed: Apr. 18, 2024

(65) Prior Publication Data

US 2024/0357739 A1 Oct. 24, 2024

(30) Foreign Application Priority Data

Apr. 24, 2023 (JP) ................................. 2023-070777

(51) Int. Cl.
| | |
|---|---|
| *H05K 1/03* | (2006.01) |
| *H05K 3/00* | (2006.01) |
| *H05K 3/46* | (2006.01) |

(52) U.S. Cl.
CPC ......... *H05K 1/0306* (2013.01); *H05K 3/0017* (2013.01); *H05K 3/4644* (2013.01); *H05K 2201/0266* (2013.01); *H05K 2201/0338* (2013.01); *H05K 2201/09154* (2013.01); *H05K 2203/0548* (2013.01); *H05K 2203/1105* (2013.01)

(58) Field of Classification Search
CPC .................................................... H05K 1/0306
USPC ......................................................... 174/256
See application file for complete search history.

(56) References Cited

U.S. PATENT DOCUMENTS

| | | | | |
|---|---|---|---|---|
| 8,581,106 B2 * | 11/2013 | Oshika | ................... | H05K 1/111 |
| | | | | 174/257 |
| 8,609,993 B2 * | 12/2013 | Kuromitsu | ............ | C04B 37/021 |
| | | | | 174/256 |
| 11,723,153 B2 * | 8/2023 | Bae | ........................ | H05K 3/181 |
| | | | | 174/256 |
| 2020/0273763 A1 * | 8/2020 | Tsuchida | .............. | H05K 3/4605 |
| 2023/0390845 A1 * | 12/2023 | Sasaki | .................... | H05K 3/067 |
| 2024/0023248 A1 * | 1/2024 | Hasegawa | ............ | H05K 1/0306 |
| 2024/0278321 A1 * | 8/2024 | Sekiguchi | ............... | B22F 7/062 |

FOREIGN PATENT DOCUMENTS

JP 2011-129665 6/2011

* cited by examiner

*Primary Examiner* — Stanley Tso
(74) *Attorney, Agent, or Firm* — STAAS & HALSEY LLP

(57) ABSTRACT

A wiring board includes: a substrate; a first seed layer provided on the substrate; a first conductive layer provided on the first seed layer; a first insulating layer provided on the first conductive layer; a second seed layer provided on the first insulating layer; and a second conductive layer provided on the second seed layer. An area of the first insulating layer is smaller than an area of the first conductive layer. An area of the second conductive layer is smaller than the area of the first insulating layer. A region of the first insulating layer not overlapping the second conductive layer includes a first region surrounding the second conductive layer and a second region outside the first region. A surface roughness of the second region is larger than a surface roughness of the first region.

12 Claims, 16 Drawing Sheets

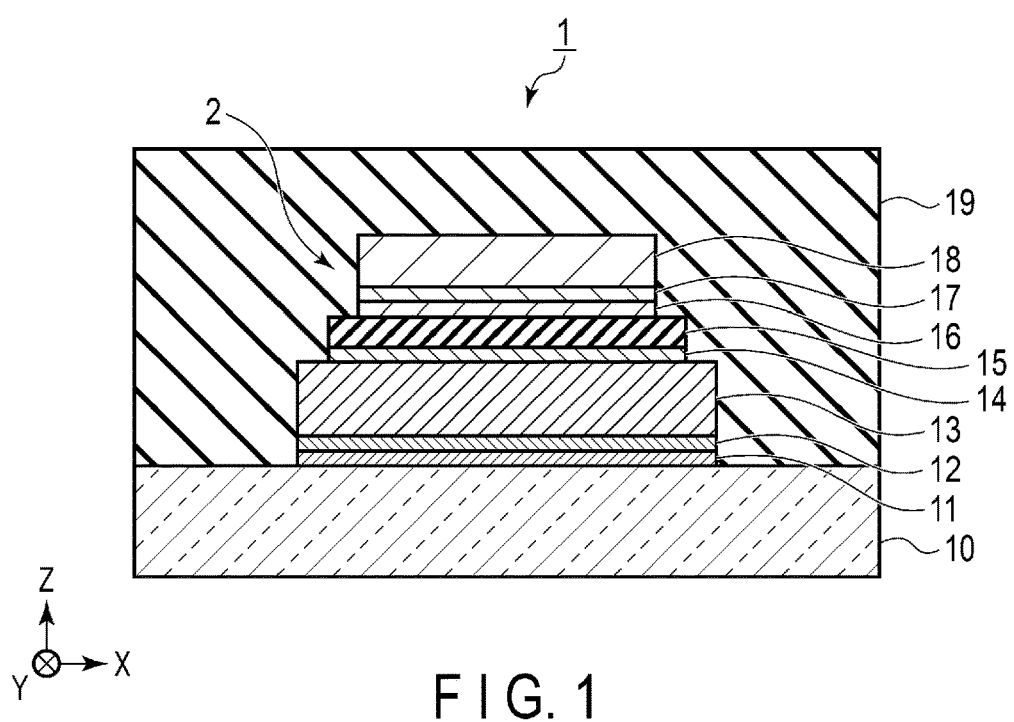
F I G. 1
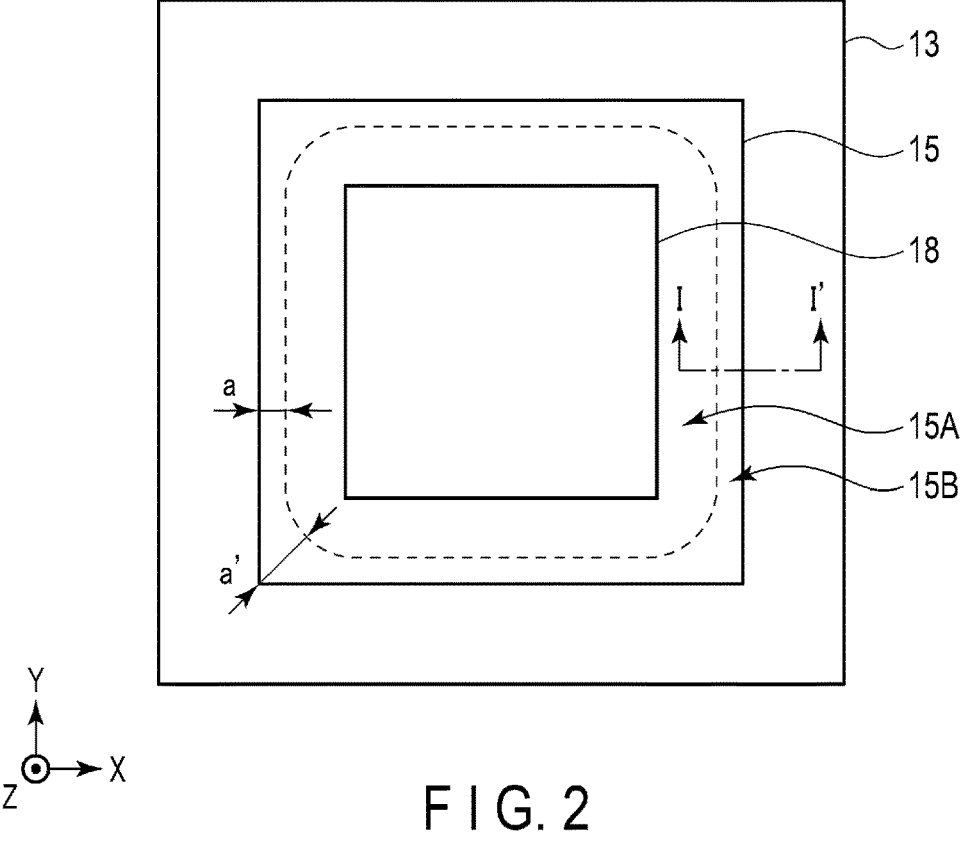
F I G. 2

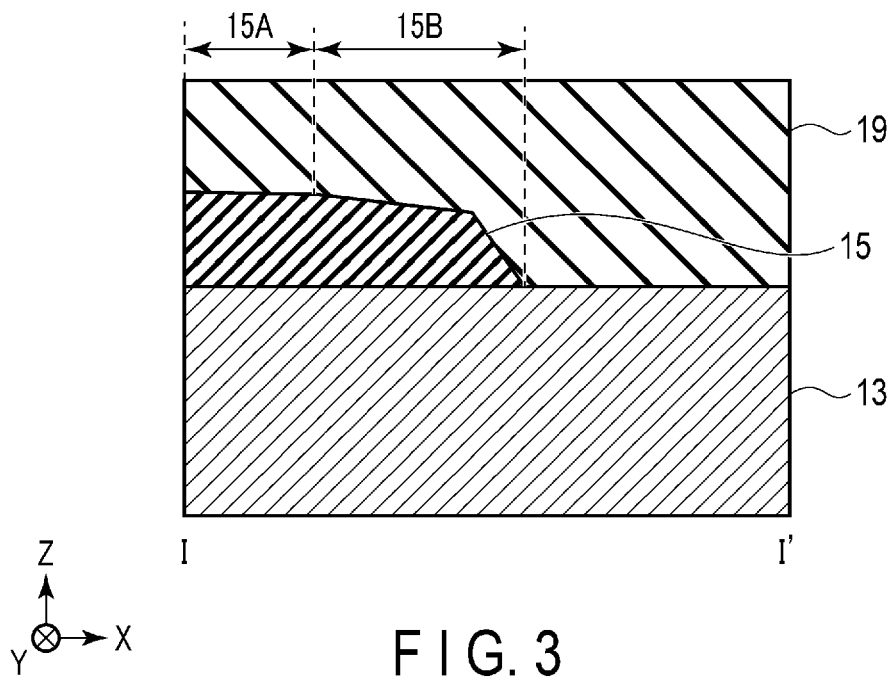
F I G. 3
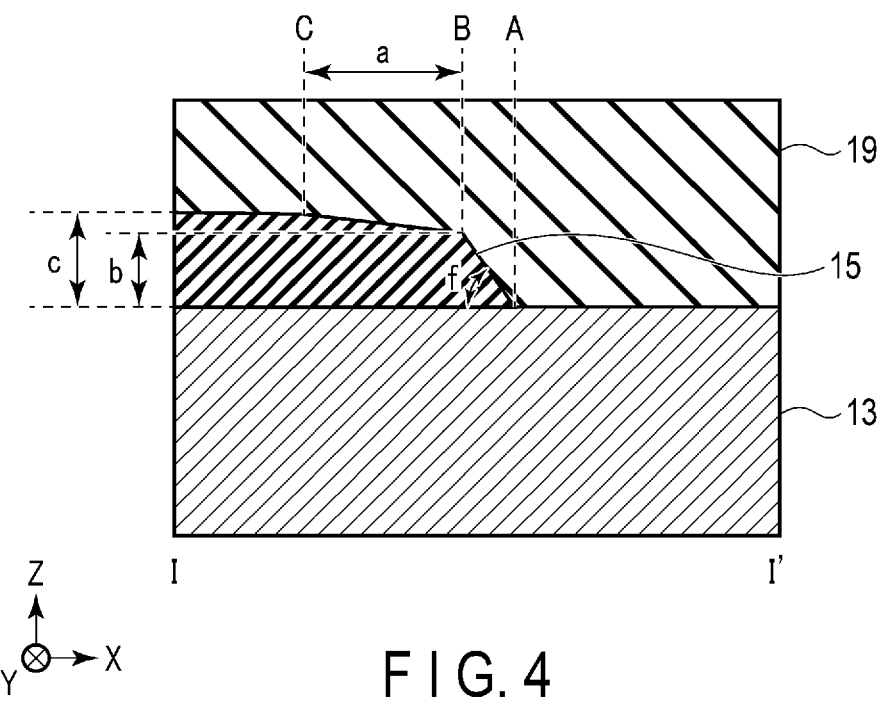
F I G. 4

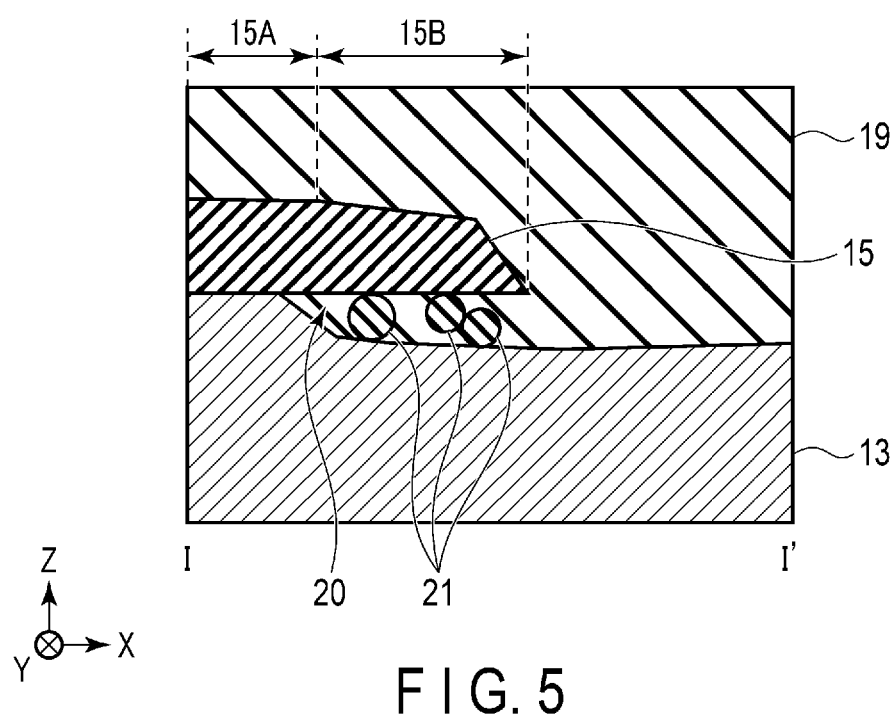
F I G. 5
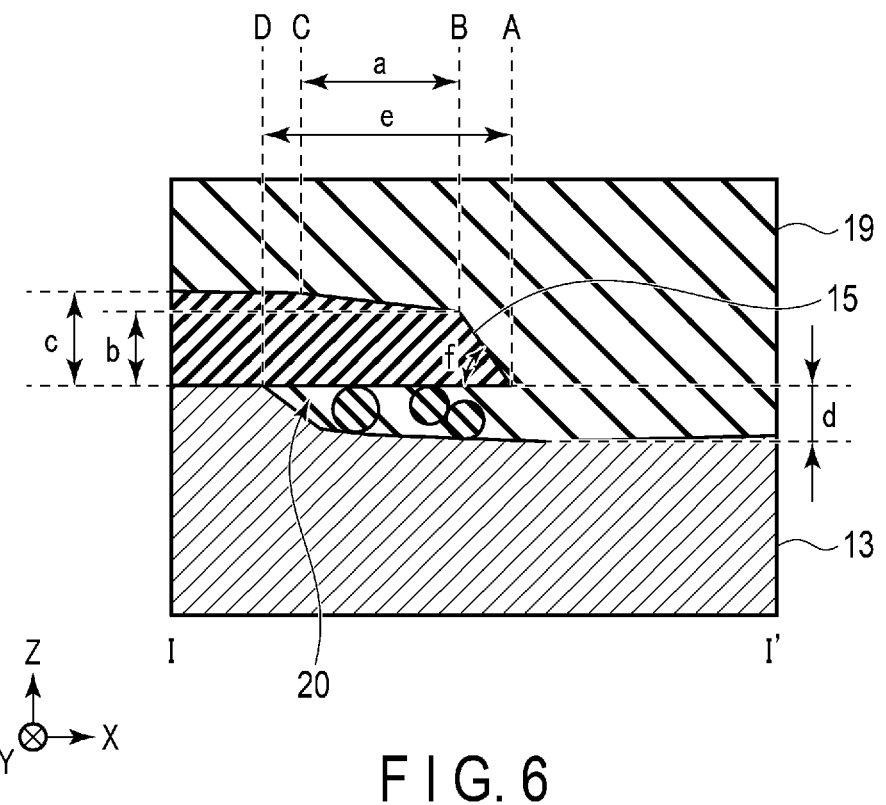
F I G. 6

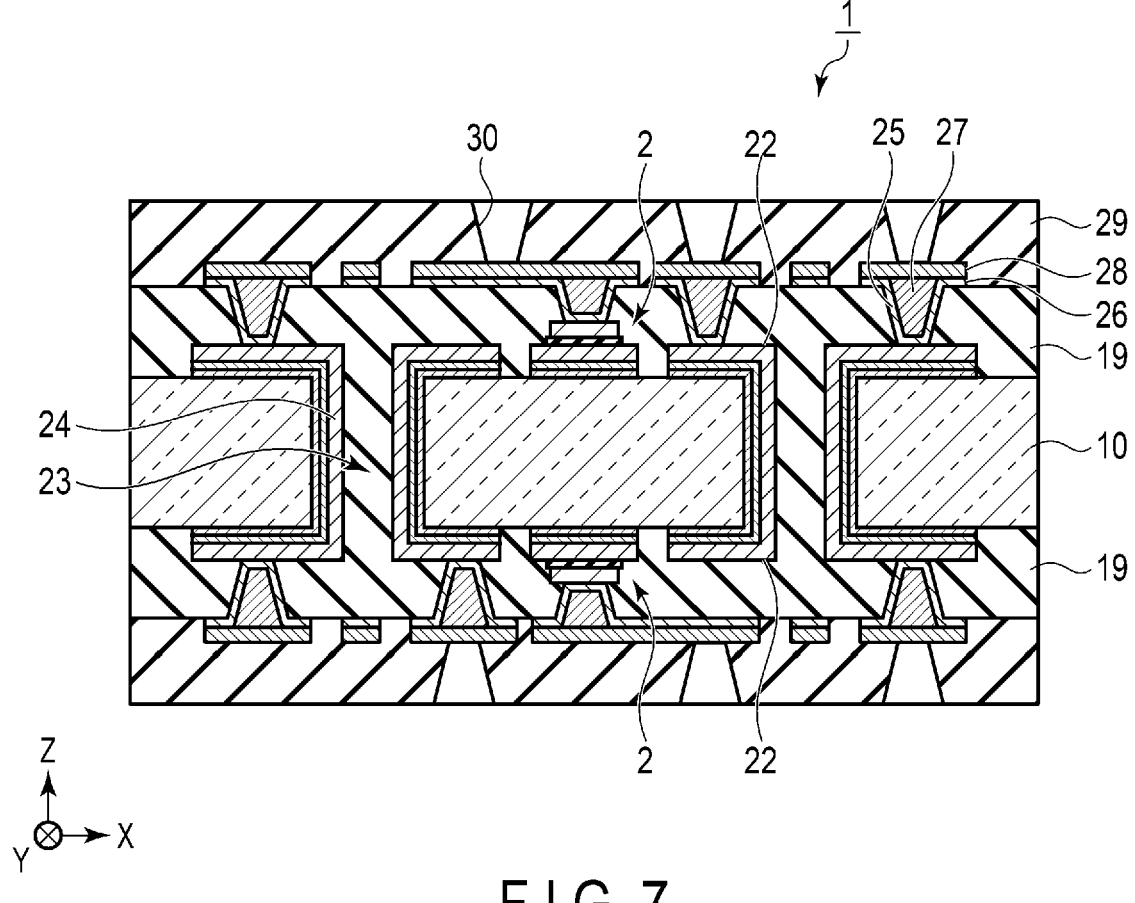
F I G. 7

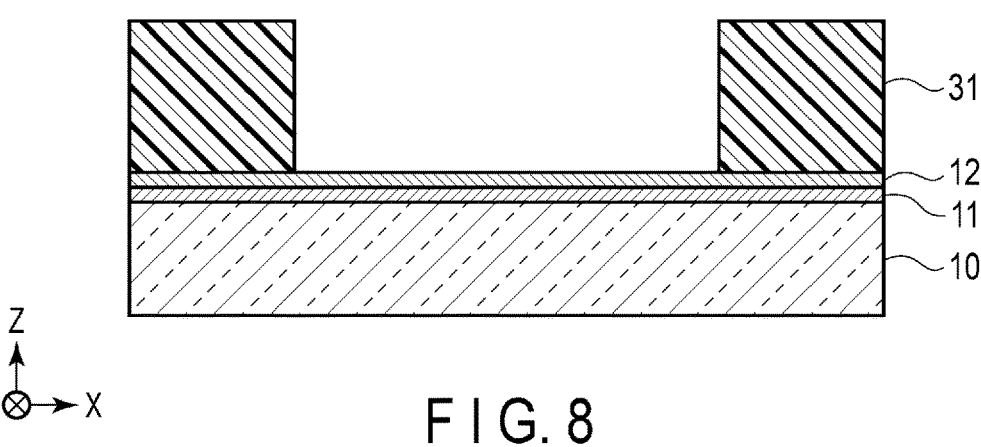
F I G. 8
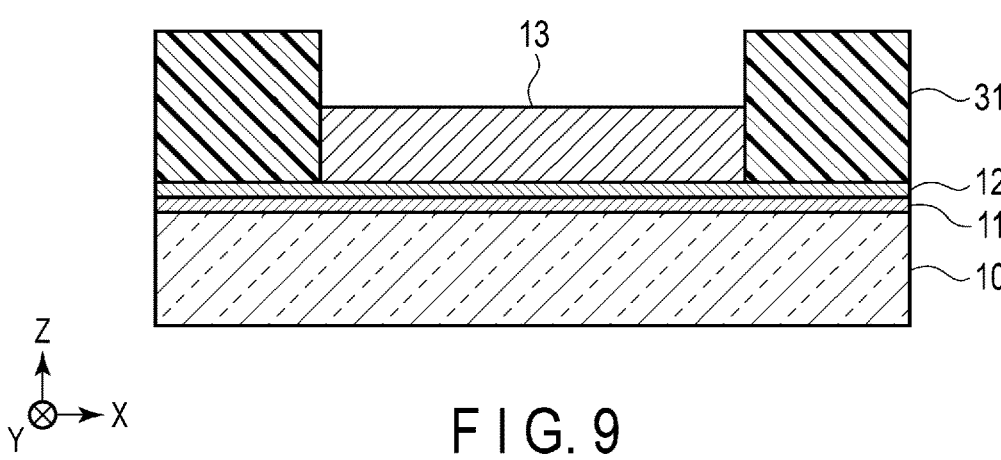
F I G. 9
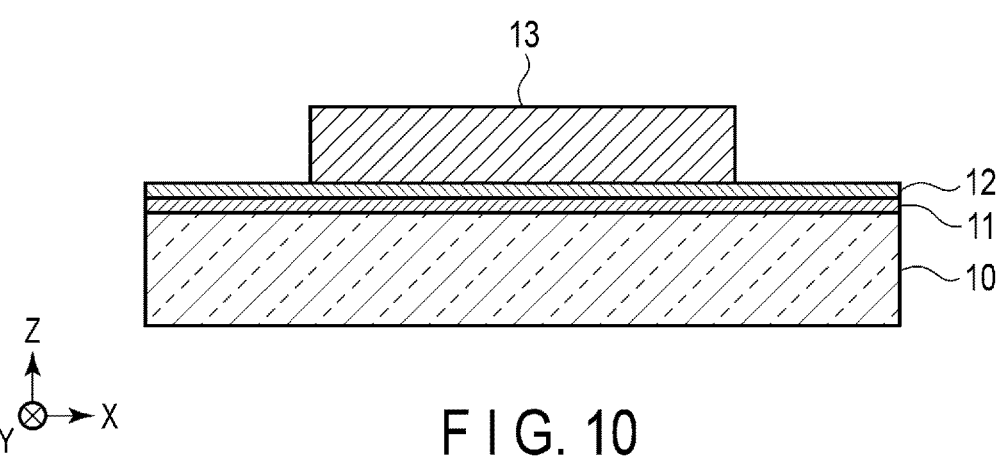
F I G. 10

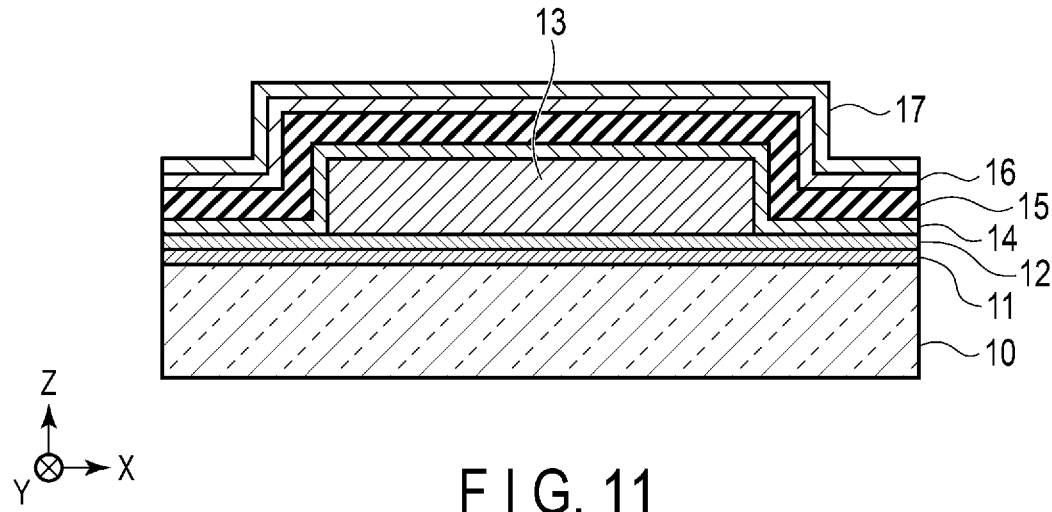
F I G. 11
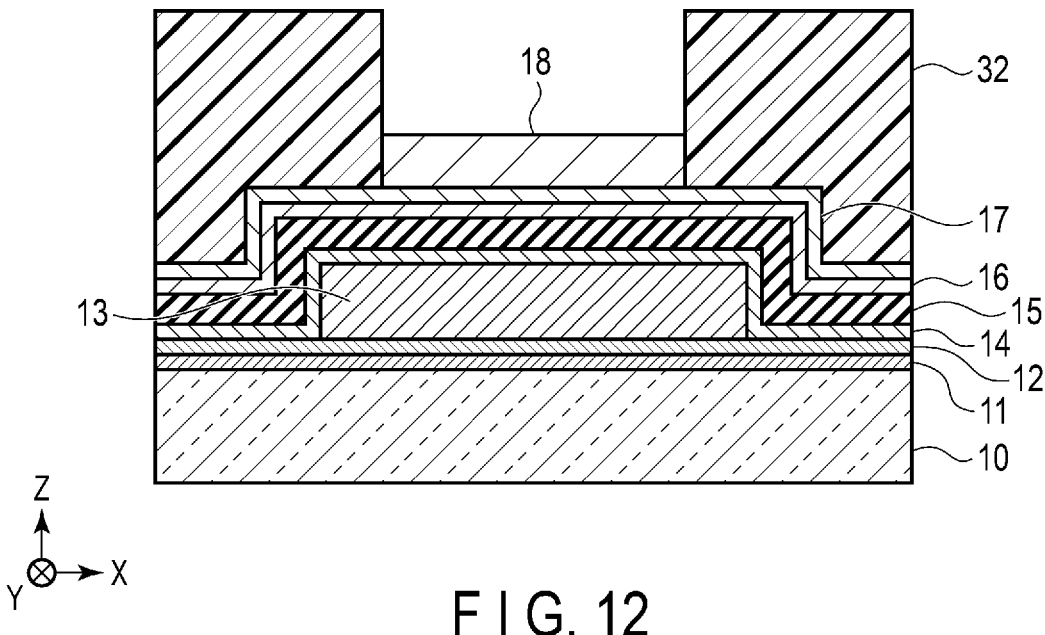
F I G. 12

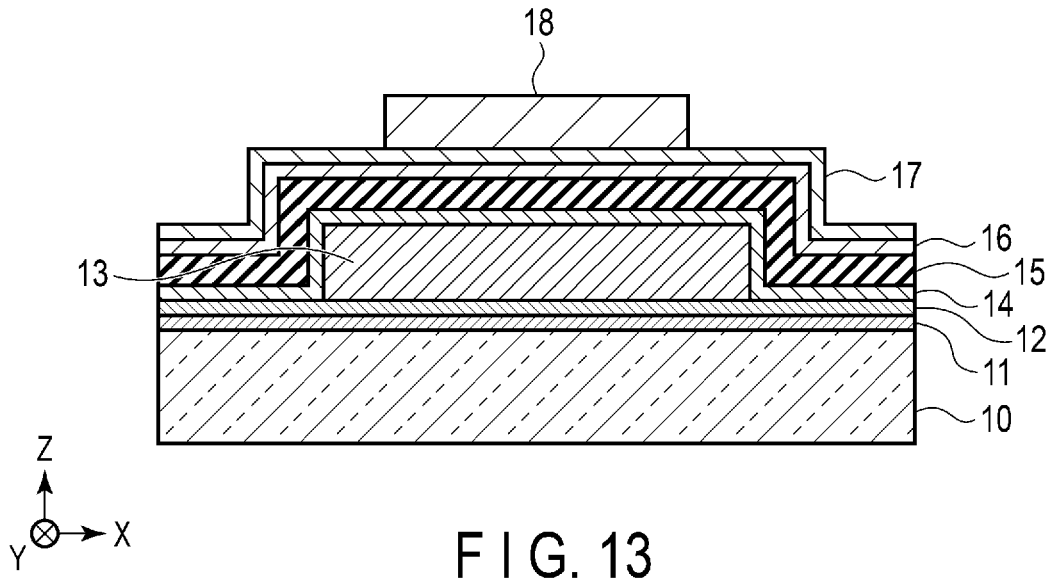
F I G. 13
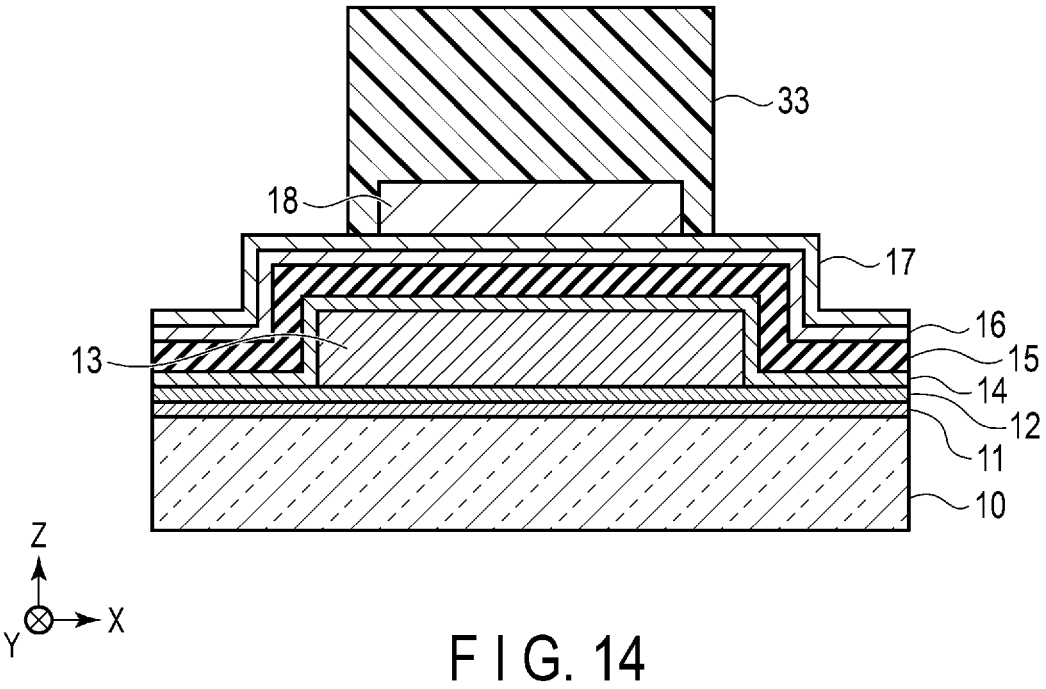
F I G. 14

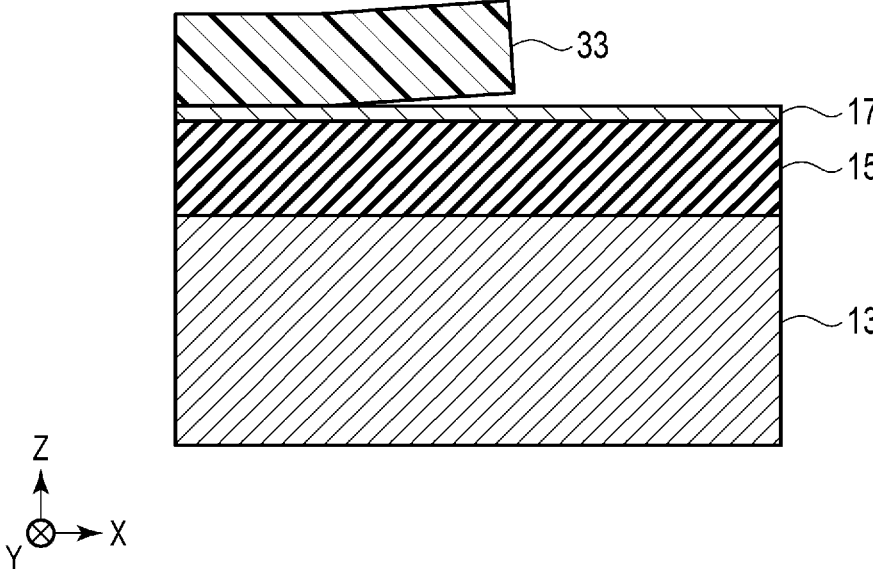
33
17
15
13
Z
Y ⊗ → X
F I G. 15

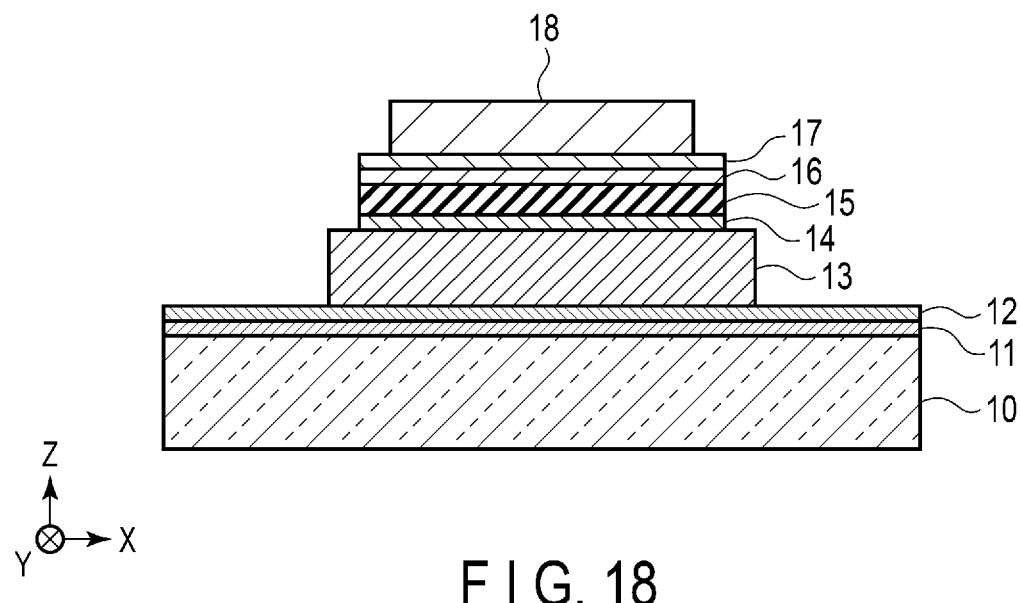
F I G. 18
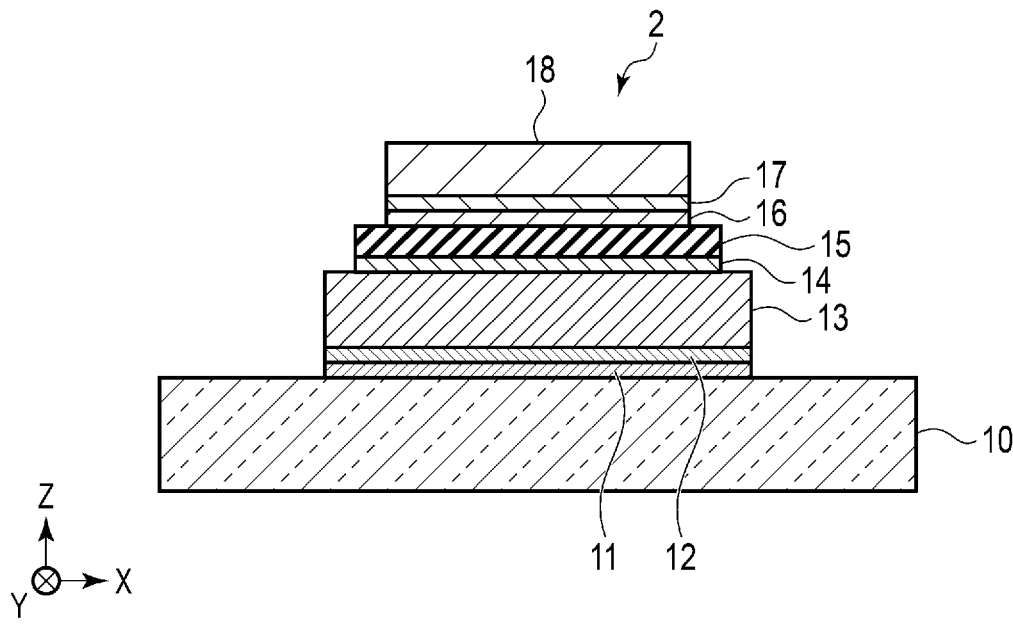
F I G. 19

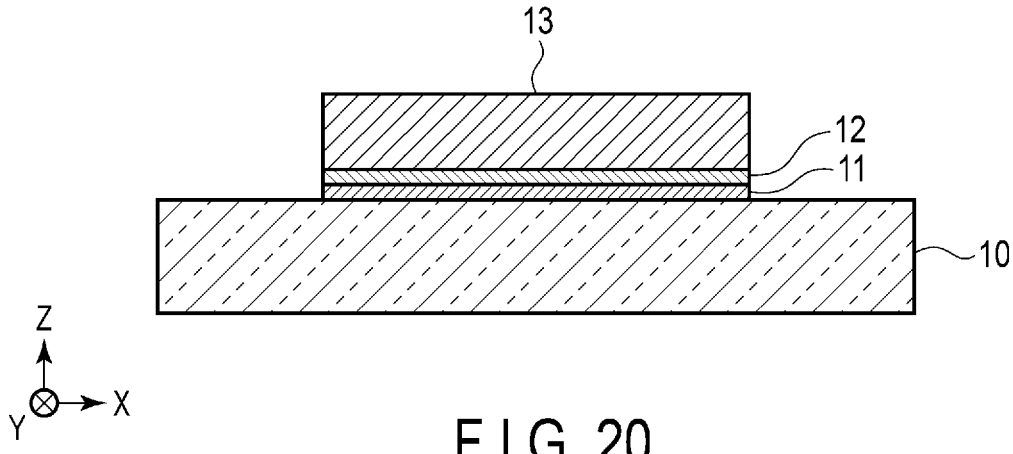
F I G. 20
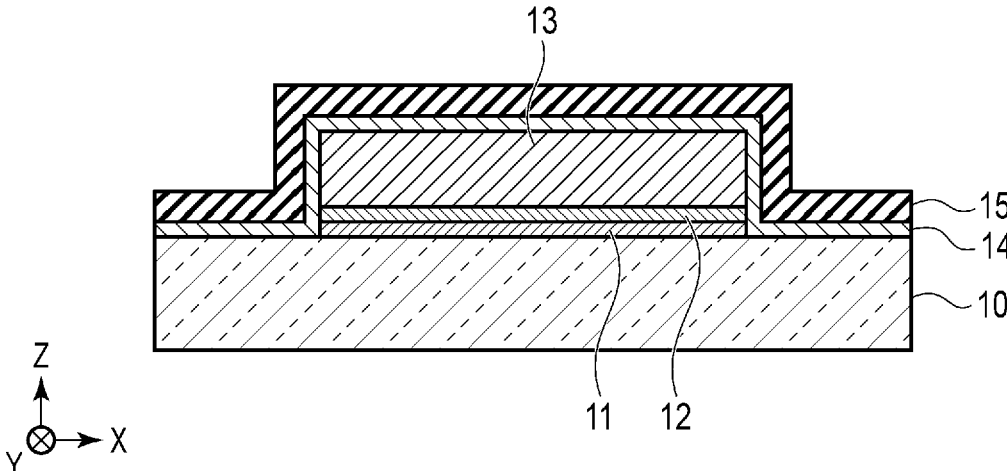
F I G. 21

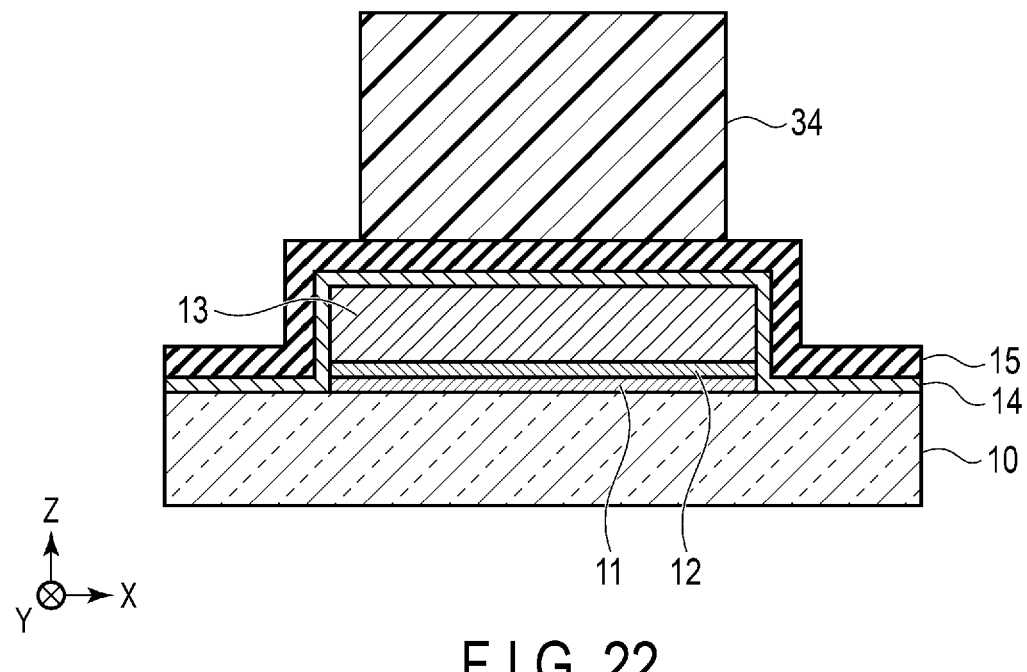
F I G. 22
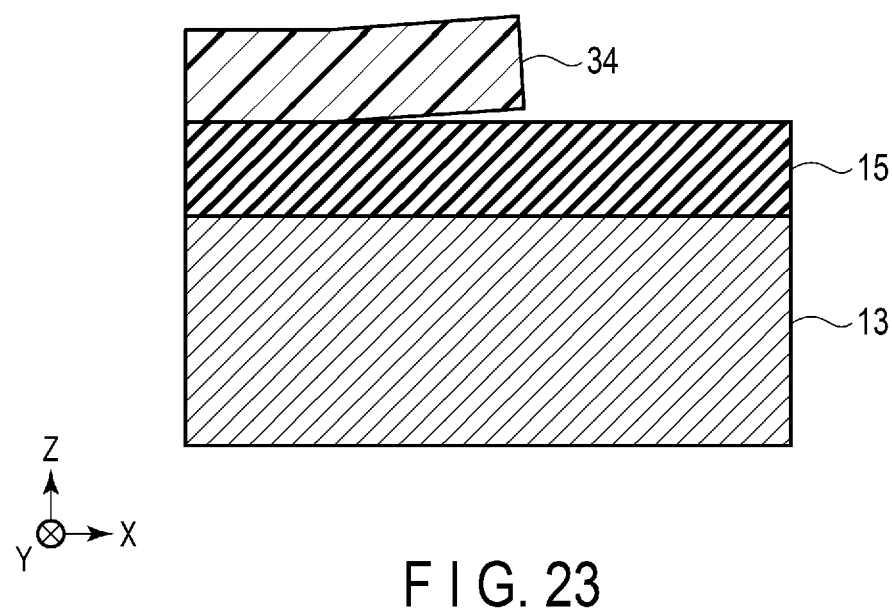
F I G. 23

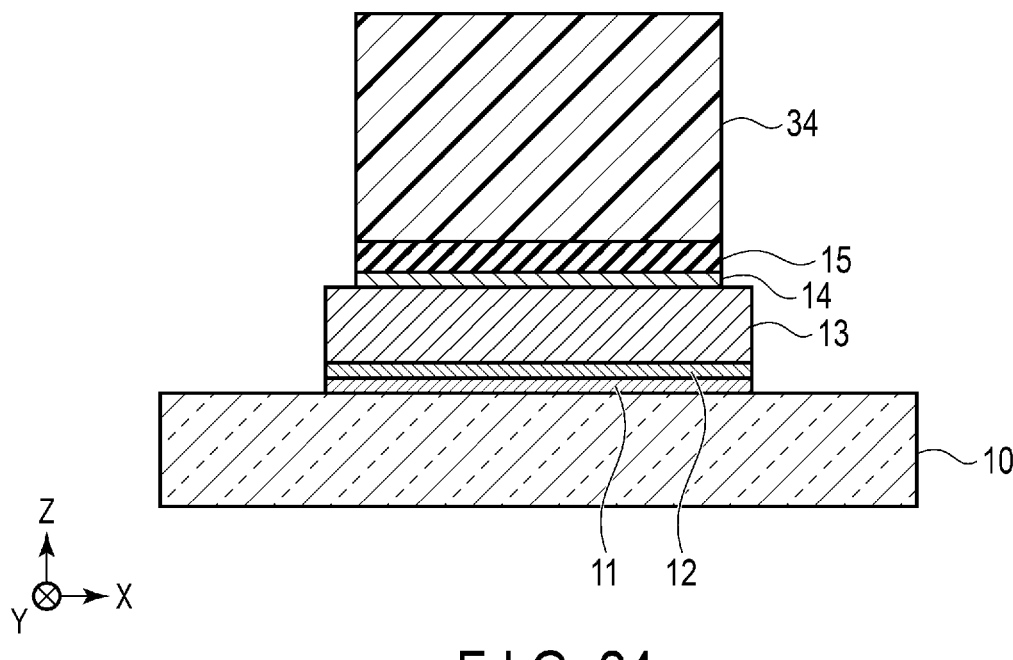
F I G. 24
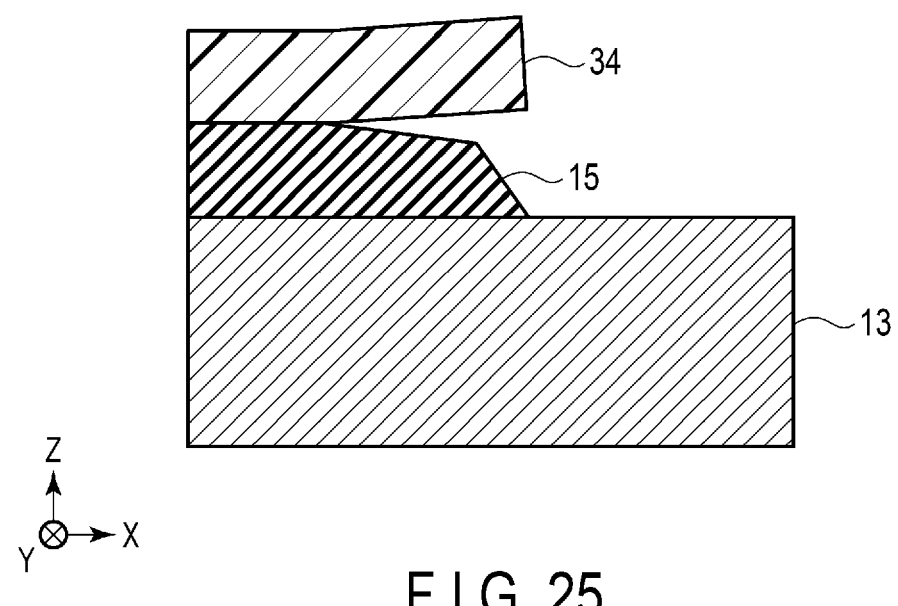
F I G. 25

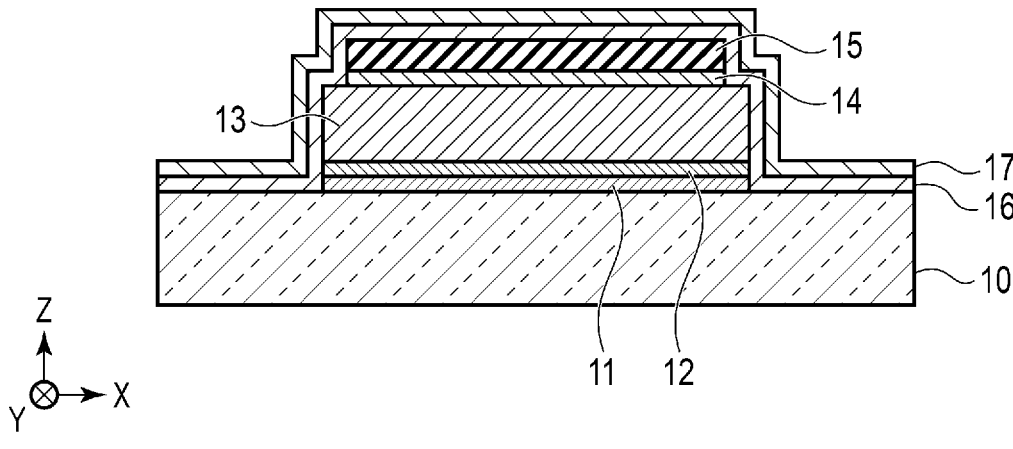
F I G. 26
F I G. 27

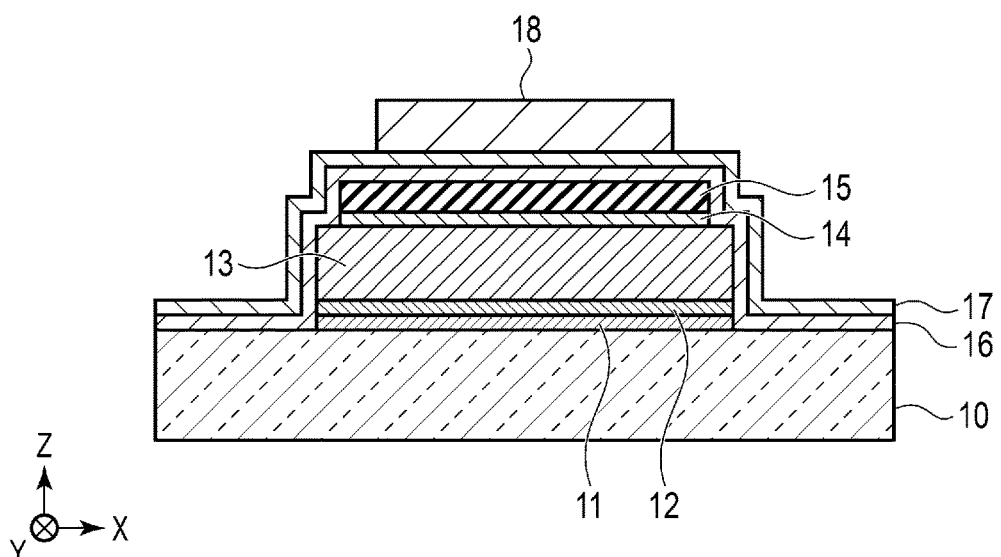
F I G. 28
| | Example 1 | Example 2 | Example 3 | Comparative example |
|---|---|---|---|---|
| Void generation rate(%) | 5 | 8 | 0 | 30 |
| Peeling generation rate(%) | 3 | 5 | 0 | 25 |
| First insulating layer crack occurrence rate(%) | 2 | 2 | 0 | 15 |
| Withstand power test results | Passed | No Data | Passed | Failed |
| Q value measurement results | 120 | No Data | 120 | 90 |
| Capacitance accuracy(%) | No Data | 0.5 | 0.5 | 1.0 |
F I G. 29

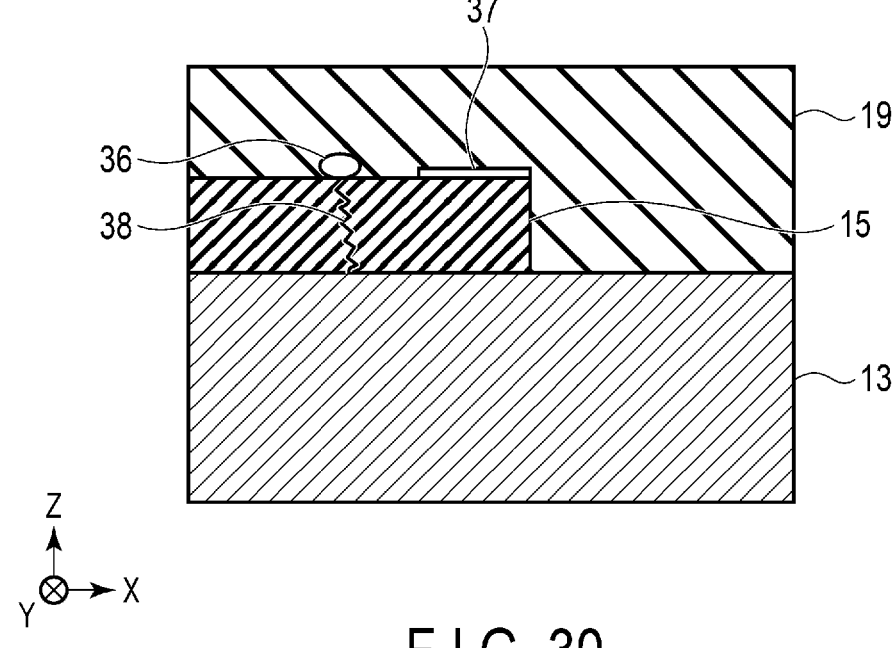
F I G. 30

WIRING BOARD AND MANUFACTURING METHOD THEREFOR

CROSS-REFERENCE TO RELATED APPLICATIONS

This application is based upon and claims the benefit of priority from prior Japanese Patent Application No. 2023-070777, filed Apr. 24, 2023, the entire contents of which are incorporated herein by reference.

FIELD

The present invention relates to a wiring board and a method for manufacturing the same.

BACKGROUND

A wiring board using a glass material as a core substrate is frequently used as an interposer. In such a wiring board, a capacitor having a metal-insulator-metal (MIM) structure in which a dielectric layer is sandwiched between a lower electrode and an upper electrode may be formed as a part of a passive circuit. Patent literature (Jpn. Pat. Appln. KOKAI Publication No. 2011-129665) discloses a method of manufacturing a laminated substrate structure in which a MIM capacitor is provided on an insulating substrate.

In order to form the MIM capacitor on the insulating substrate and form a wiring or the like on the MIM capacitor, it is necessary to secure adhesion between the MIM capacitor and a surrounding insulating layer. Therefore, a method has been known in which fine irregularities are formed on the surfaces of the wiring and the lower electrode by so-called blackening treatment, reduction treatment, or the like to improve a mechanical bonding strength by an anchor effect. However, when the above-described fine irregularities are present on the surface of the lower electrode in the region where a dielectric layer of the MIM capacitor is formed, a leakage current due to electric field concentration increases, and the characteristics and reliability of the MIM capacitor are greatly deteriorated.

Therefore, the patent literature discloses a manufacturing method for obtaining a highly reliable MIM capacitor by forming a protective conductive layer under a dielectric layer and forming fine irregularities on an upper electrode and a lower electrode in a state where a surface of the lower electrode is smoothed. However, in order to ensure the adhesion between the MIM capacitor and the surrounding insulating layer, it is necessary not only to improve a mechanical bonding strength at an interface between the wiring, the lower electrode, and the upper electrode, and the insulating layer, but also to ensure the adhesion at the interface between the dielectric layer and the insulating layer.

Next, a conventional example of a wiring board having a MIM capacitor will be described with reference to FIG. 30. FIG. 30 is a partial cross-sectional view of the MIM capacitor, illustrating a first conductive layer 13 as a lower electrode, a first insulating layer 15 as a dielectric layer, and a second insulating layer 19 covering a periphery of the MIM capacitor. As in the conventional example, in a case where adhesion between the first insulating layer 15 and the second insulating layer 19 is not sufficiently secured, there is a possibility that a void 36 is generated at an interface between the first insulating layer 15 and the second insulating layer 19, or peeling 37 is generated at an interface between the MIM capacitor and the second insulating layer 19. In addition, there is a possibility that stress is applied to the void 36 and a crack 38 occurs in the first insulating layer 15.

Furthermore, when the MIM capacitor is energized, a leakage current is generated from an upper electrode to a lower electrode through an upper surface and a side surface of the dielectric layer, and there is a possibility that withstand power characteristics of the MIM capacitor are deteriorated. In addition, in a case where a roughness of the interface between the upper electrode and the lower electrode of the MIM capacitor and the dielectric layer is large, a parasitic resistance of the MIM capacitor increases, and the characteristics such as a Q value of the capacitor may be deteriorated.

SUMMARY

A first aspect of the present invention provides a wiring board, comprising: a substrate having an insulating surface; a first seed layer provided on the substrate; a first conductive layer provided on the first seed layer; a first insulating layer provided on the first conductive layer; a second seed layer provided on the first insulating layer; a second conductive layer provided on the second seed layer; and a second insulating layer provided around the first seed layer, the first conductive layer, the first insulating layer, the second seed layer, and the second conductive layer, wherein an area of the first insulating layer is smaller than an area of the first conductive layer, an area of the second conductive layer is smaller than the area of the first insulating layer, a region of the first insulating layer not overlapping the second conductive layer includes a first region surrounding the second conductive layer and a second region outside the first region, and a surface roughness of the second region is larger than a surface roughness of the first region.

A second aspect of the present invention provides the wiring board according to the first aspect, wherein a thickness of the second region is smaller than a thickness of the first region.

A third aspect of the present invention provides the wiring board according to the first aspect, wherein a width of each of four corners of the second region is larger than a width of a linear portion of the second region.

A fourth aspect of the present invention provides the wiring board according to the first aspect, wherein a ratio of a surface roughness of the second region to a surface roughness of the first region is 1.2 or more and 10 or less.

A fifth aspect of the present invention provides the wiring board according to the first aspect, wherein a width of the second region is 1 μm or more and 10 μm or less.

A sixth aspect of the present invention provides the wiring board according to the first aspect, wherein a surface roughness of a lower surface of the first insulating layer is smaller than a surface roughness of the second region.

A seventh aspect of the present invention provides the wiring board according to the first aspect, wherein a side wall of the first insulating layer has a forward tapered shape.

An eighth aspect of the present invention provides the wiring board according to the first aspect, wherein the first conductive layer includes a side etching portion provided under an end of the first insulating layer.

A ninth aspect of the present invention provides the wiring board according to the eighth aspect, wherein a surface roughness of a region of the first conductive layer where the side etching portion is provided is larger than a surface roughness of a region other than the side etching portion.

A tenth aspect of the present invention provides the wiring board according to the eighth aspect, wherein a ratio of a width to a height of the side etching portion is 0.03 or more and 50 or less.

An eleventh aspect of the present invention provides the wiring board according to the eighth aspect, wherein the second insulating layer includes one or more fillers provided in the side etching portion.

A twelfth aspect of the present invention provides the wiring board according to the eleventh aspect, wherein a size of the filler is ½ or more of a height of the side etching portion.

A thirteenth aspect of the present invention provides a method for manufacturing a wiring board, the method comprising: forming a first seed layer on a substrate having an insulating surface; forming a first conductive layer on the first seed layer; forming a first insulating layer on the first conductive layer; forming a second seed layer on the first insulating layer; forming a second conductive layer on the second seed layer; forming a mask layer on the second seed layer and the second conductive layer, the mask layer covering a region where the first insulating layer is to be formed; performing a heat treatment on the substrate; etching the second seed layer and the first insulating layer using the mask layer as a mask; and forming a second insulating layer around the first seed layer, the first conductive layer, the first insulating layer, the second seed layer, and the second conductive layer.

A fourteenth aspect of the present invention provides the method for manufacturing a wiring board according to the thirteenth aspect, further comprising etching an exposed portion of the first seed layer to form a side etching portion in the first conductive layer after the etching the first insulating layer.

A fifteenth aspect of the present invention provides a method for manufacturing a wiring board, comprising: forming a first seed layer on a substrate having an insulating surface; forming a first conductive layer on the first seed layer; forming a first insulating layer on the first conductive layer; forming a mask layer on the first insulating layer; performing a heat treatment on the substrate; etching the first insulating layer using the mask layer as a mask; forming a second seed layer on the first insulating layer; forming a second conductive layer on the second seed layer; and forming a second insulating layer around the first seed layer, the first conductive layer, the first insulating layer, the second seed layer, and the second conductive layer.

A sixteenth aspect of the present invention provides the method for manufacturing a wiring board according to the fifteenth aspect, further comprising etching an exposed portion of the second seed layer using the second conductive layer as a mask to form a side etching portion in the first conductive layer after the forming the second conductive layer.

BRIEF DESCRIPTION OF THE DRAWINGS

FIG. 1 is a cross-sectional view of a wiring board according to a first embodiment of the present invention.

FIG. 2 is a plan view of a first conductive layer, a first insulating layer, and a second conductive layer.

FIG. 3 is a partial cross-sectional view taken along line I-I' of FIG. 2.

FIG. 4 is a diagram illustrating dimensions of an end region of the first insulating layer.

FIG. 5 is a partial cross-sectional view mainly illustrating a first conductive layer and a first insulating layer according to another example.

FIG. 6 is a diagram illustrating dimensions of an end region of the first insulating layer and a side etching portion.

FIG. 7 is a cross-sectional view of a wiring board including multilayer wiring.

FIG. 8 is a cross-sectional view illustrating a manufacturing process of the wiring board according to the first embodiment.

FIG. 9 is a cross-sectional view illustrating the manufacturing process of the wiring board according to the first embodiment.

FIG. 10 is a cross-sectional view illustrating the manufacturing process of the wiring board according to the first embodiment.

FIG. 11 is a cross-sectional view illustrating the manufacturing process of the wiring board according to the first embodiment.

FIG. 12 is a cross-sectional view illustrating the manufacturing process of the wiring board according to the first embodiment.

FIG. 13 is a cross-sectional view illustrating the manufacturing process of the wiring board according to the first embodiment.

FIG. 14 is a cross-sectional view illustrating the manufacturing process of the wiring board according to the first embodiment.

FIG. 15 is a cross-sectional view illustrating the manufacturing process of the wiring board according to the first embodiment.

FIG. 18 is a cross-sectional view illustrating the manufacturing process of the wiring board according to the first embodiment.

FIG. 19 is a cross-sectional view illustrating the manufacturing process of the wiring board according to the first embodiment.

FIG. 20 is a cross-sectional view illustrating a manufacturing process of a wiring board according to a second embodiment.

FIG. 21 is a cross-sectional view illustrating the manufacturing process of the wiring board according to the second embodiment.

FIG. 22 is a cross-sectional view illustrating the manufacturing process of the wiring board according to the second embodiment.

FIG. 23 is a cross-sectional view illustrating the manufacturing process of the wiring board according to the second embodiment.

FIG. 24 is a cross-sectional view illustrating the manufacturing process of the wiring board according to the second embodiment.

FIG. 25 is a cross-sectional view illustrating the manufacturing process of the wiring board according to the second embodiment.

FIG. 26 is a cross-sectional view illustrating the manufacturing process of the wiring board according to the second embodiment.

FIG. 27 is a cross-sectional view illustrating the manufacturing process of the wiring board according to the second embodiment.

FIG. 28 is a cross-sectional view illustrating the manufacturing process of the wiring board according to the second embodiment.

FIG. 29 is a diagram illustrating a test result of a MIM capacitor.

FIG. 30 is a cross-sectional view of a MIM capacitor according to a conventional example.

DETAILED DESCRIPTION

Figure 16:
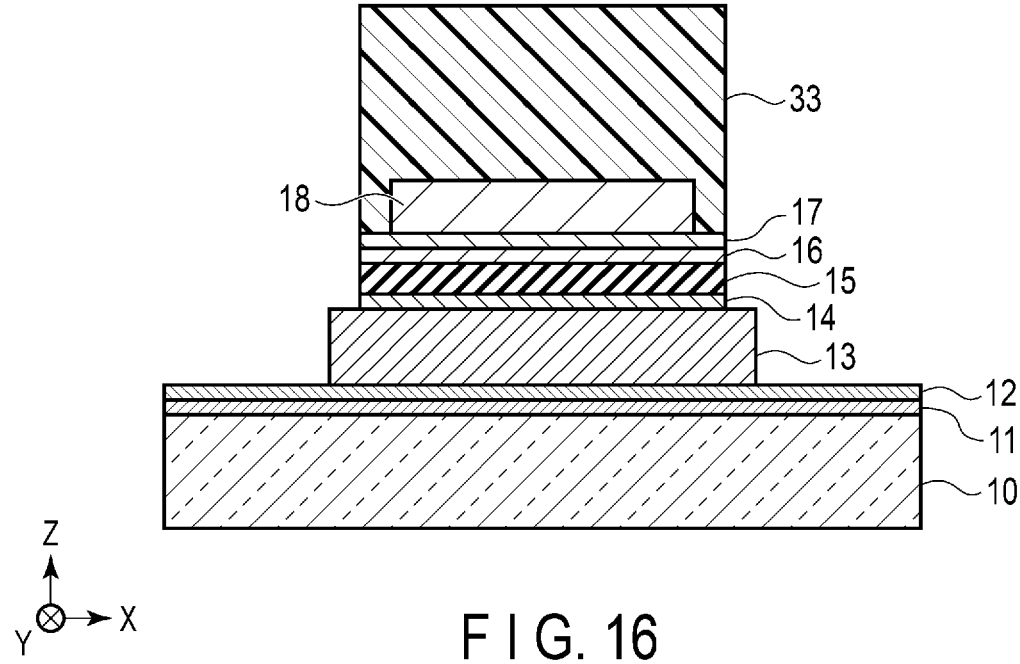
FIG. 16 is a cross-sectional view illustrating the manufacturing process of the wiring board according to the first embodiment.

Hereinafter, embodiments of the present invention will be described with reference to the drawings. The following embodiment exemplifies a configuration for embodying the technical idea of the present invention, and the technical idea of the present invention is not limited by the material, shape, structure, and the like of the following constituent members. In the following description, elements having the same functions and configurations are denoted by the same reference numerals, and redundant description will be omitted.

Note that the position, size, shape, range, and the like of each component illustrated in the drawings may not represent the actual position, size, shape, range, and the like in order to facilitate understanding of the invention. Therefore, the present invention is not necessarily limited to the position, size, shape, range, and the like disclosed in the drawings.

In defining a positional relationship between an element and another element, "above" or "below" is not limited to a case where another element is disposed immediately above or below one element, and includes a case where another element is further interposed between those elements. In contrast, in a case where reference is made to be provided directly above or below, there are no intervening elements present.

A "surface" may refer not only to a surface of a plate-shaped member but also to an interface of a layer substantially parallel to the surface of the plate-shaped member with respect to a layer included in the plate-shaped member. In addition, an "upper surface" and a "lower surface" mean surfaces illustrated above or below the drawings in a case where a plate member or a layer included in the plate member is illustrated. The "upper surface" and the "lower surface" may be referred to as a "first surface" and a "second surface", respectively.

The "side surface" means a surface of a plate member or a layer included in the plate member or a portion of the thickness of the layer. Further, a part of the surface and the side surface may be collectively referred to as an "end".

In addition, "planar shape" and "plan view" mean a shape in a case where a surface or a layer is visually recognized from above, that is, from a positive direction to a negative direction in a Z axis. Further, the "cross-sectional shape" and the "cross-sectional view" mean a shape in a case where the plate-shaped member or the layer is visually recognized from the horizontal direction in the case of cutting in a specific direction.

<1> First Embodiment

<1-1> Configuration of Wiring Board 1

In the present specification, a wiring board means a structure including a substrate and a stack provided on the substrate and including an insulating layer and a conductive layer. The stack provided on a substrate includes an electronic component (including a capacitor) and wiring. The wiring board can be used as an interposer that relays components having different inter-terminal distances, such as an integrated circuit (IC) chip and a printed wiring board having different wiring design rules.

A wiring board according to an embodiment of the present invention has a MIM structure in which an insulating layer is sandwiched between conductive layers containing metal or the like. Hereinafter, the MIM structure will be described as a MIM capacitor in which an insulating layer as a dielectric layer is sandwiched between an upper electrode and a lower electrode. Hereinafter, the structure of the wiring board including such a MIM capacitor will be specifically described.

FIG. 1 is a cross-sectional view of a wiring board 1 according to a first embodiment of the present invention. FIG. 1 is a cross-sectional view obtained by extracting a part of the wiring board 1. In FIG. 1, an X direction is a direction along a certain side of the wiring board 1, a Y direction is a direction orthogonal to the X direction in a horizontal plane of the wiring board 1, and a Z direction is a direction orthogonal to an XY plane.

The wiring board 1 includes a substrate 10 and a MIM capacitor 2 provided on the substrate 10. The MIM capacitor 2 includes a first seed layer 12, a first conductive layer 13, a first insulating layer 15, a second seed layer 17, and a second conductive layer 18 laminated in this order on the substrate 10. A second insulating layer 19 covering the MIM capacitor 2 is provided on the substrate 10. The first conductive layer 13 serves as a lower electrode of the MIM capacitor 2, the first insulating layer 15 serves as a dielectric layer of the MIM capacitor 2, and the second conductive layer 18 serves as an upper electrode of the MIM capacitor 2.

In the present embodiment, as an example, an adhesion layer 11 is provided on the substrate 10, a lower adhesion layer 14 is provided under the first insulating layer 15, and an upper adhesion layer 16 is provided on the first insulating layer 15. The adhesion layer is configured to improve adhesion between upper and lower layers of the adhesion layer. The adhesion layer 11, the lower adhesion layer 14, and the upper adhesion layer 16 may or may not be disposed.

Hereinafter, the configuration, material, shape, and the like of each element of the MIM capacitor 2 will be described in detail.

(Substrate 10)

The substrate 10 has an insulating property on the surface. The substrate 10 is desirably made of transparent glass having optical transparency. A component of glass or a blending ratio of each component contained in glass, and a method for producing glass are not particularly limited.

Examples of the glass include non-alkali glass, alkali glass, borosilicate glass, quartz glass, sapphire glass, and photosensitive glass, but any glass material containing a silicate as a main component may be used. Furthermore, other so-called glass materials may be used. However, in a case where a semiconductor is mounted on the substrate 10 of the present embodiment and used, it is desirable to use non-alkali glass.

A thickness of the glass substrate is desirably 1 mm or less. A thickness of the glass substrate is more desirably 0.1 mm or more and 0.8 mm or less in consideration of ease of a process of forming a through-hole in glass and handling properties at the time of manufacturing.

Examples of the method for producing the glass substrate include a float method, a down draw method, a fusion method, an up draw method, a roll-out method, and the like, but a glass material produced by any method may be used, and the method is not limited to that of the present embodiment.

A linear expansion coefficient of glass is desirably −1 ppm/K or more and 15.0 ppm/K or less. As a reason therefor, in a case where the content is −1 ppm/K or less, it is difficult to select the glass material itself, and the glass material cannot be produced at low cost. On the other hand, in the case of 15.0 ppm/K or more, a difference in linear expansion coefficient from other layers increases, and the reliability decreases. In addition, in a case where a silicon chip is mounted on the substrate 10, connection reliability with the silicon chip decreases.

The linear expansion coefficient of glass is more desirably 0.5 ppm/K or more and 8.0 ppm/K or less, still more desirably 1.0 ppm/K or more and 4.0 ppm/K or less.

A functional film such as an antireflection film or an IR cut filter may be formed on the glass substrate in advance. In addition, functions such as strength imparting, antistatic imparting, coloring, and texture control may be imparted. Examples of these functional films include, but are not limited to, a hard coat film for strength application, an antistatic film for antistatic application, an optical filter film for coloring, and an anti-glare/light scattering film for texture control. As a method for forming these functional films, a film forming technique such as vapor deposition, a sputtering method, or a wet method is used.

(First Seed Layer 12)

The first seed layer 12 functions as a power supply layer for electroplating in a step of forming first conductive layer 13 by a semi-additive method.

As the seed layer provided on the substrate 10 and inner walls of the through-holes formed in the substrate 10, for example, a single substance of Cu, Ni, Al, Ti, Cr, Mo, W, Ta, Au, Ir, Ru, Pd, Pt, AlSi, AlSiCu, AlCu, NiFe, ITO, IZO, AZO, ZnO, PZT, TiN, $Cu_3N_4$, or a Cu alloy, or a stack of a plurality of these substances is used. The seed layer is formed by, for example, a sputtering method or a chemical vapor deposition (CVD) method. The first seed layer 12 is desirably made of Cu because an unnecessary portion can be easily etched.

An electroless plating layer may be formed above the first seed layer 12. Examples of the electroless plating layer include electroless copper plating, electroless nickel plating, and the like.

(Adhesion Layer 11, Lower Adhesion Layer 14, Upper Adhesion Layer 16)

In the present embodiment, before the first seed layer 12 is formed on the substrate 10, it is desirable to form the adhesion layer 11 on the upper surface of the substrate 10 in consideration of electrical characteristics, ease of manufacturing, and cost. As the adhesion layer 11, for example, a titanium layer formed by a sputtering method is used.

In addition, it is desirable to form the lower adhesion layer 14 on the first conductive layer 13 before forming the first insulating layer 15 on the first conductive layer 13. Further, it is desirable to form the upper adhesion layer 16 on the first insulating layer 15 before forming the second seed layer 17 on the first insulating layer 15. The lower adhesion layer 14 has a function of improving adhesion between the first conductive layer 13 as a lower electrode and the first insulating layer 15 as a dielectric layer. The upper adhesion layer 16 has a function of improving adhesion between the first insulating layer 15 as a dielectric layer and the second seed layer 17.

The lower adhesion layer 14 and the upper adhesion layer 16 are made of, for example, Ti. In addition, for example, a simple substance of Cu, Ni, Al, Cr, Mo, W, Ta, Au, Ir, Ru, Pd, Pt, AlSi, AlSiCu, AlCu, NiFe, or a Cu alloy, or a stack of a plurality of these may be used. Ti is excellent from the viewpoint of adhesion, electrical conductivity, ease of production, and cost.

The thickness of each of the lower adhesion layer 14 and the upper adhesion layer 16 is desirably, for example, 10 nm or more and 1 μm or less. In a case where the thickness is less than 10 nm, the adhesion strength may be insufficient. In a case where the thickness is more than 1 μm, not only film formation time is too long and mass productivity is poor in a manufacturing process to be described later, but also it may take more time in a process of removing unnecessary portions. The thickness of each of the lower adhesion layer 14 and the upper adhesion layer 16 is more desirably 10 nm or more and 500 nm or less. The lower adhesion layer 14 and the upper adhesion layer 16 may have different thicknesses, but are desirably the same thickness because they are structurally simple.

In a case where adhesion between the first conductive layer 13 and the first insulating layer 15 is sufficient, the lower adhesion layer 14 may not be provided. In a case where the adhesion between the first insulating layer 15 and the second seed layer 17 is sufficient, the upper adhesion layer 16 may not be provided.

(First Conductive Layer 13, Lower Electrode)

The adhesion layer 11, the first seed layer 12, and the first conductive layer 13 provided on the substrate 10 serve as a lower electrode of the MIM capacitor 2 in a region on the substrate 10 where the MIM capacitor 2 is provided.

As the first conductive layer 13, for example, Cu, Ni, Cr, Pd, Au, Rh, or Ir is used. The first conductive layer 13 is desirably made of Cu because it has good electrical conductivity and is inexpensive. The first conductive layer 13 is formed by an electrolytic plating method using the first seed layer 12 for power supply.

The thickness of the first conductive layer 13 is desirably 3 μm or more and 30 μm or less. In a case where the thickness is less than 3 μm, there is a possibility that a circuit disappears due to etching processing after the first conductive layer 13 is formed. In addition, there is a risk that the connection reliability and electrical conductivity of the circuit are reduced. In a case where the thickness is larger than 30 μm, it is necessary to form a resist layer having a thickness of 30 μm or more, and the manufacturing cost increases. Furthermore, since resist resolution is reduced, it is difficult to form fine wiring with a pitch of 30 μm or less. The thickness of the first conductive layer 13 is more desirably 5 μm or more and 25 μm or less. The thickness is more preferably 10 μm or more and 20 μm or less.

(First Conductive Layer 13, Wiring)

The adhesion layer 11, the first seed layer 12, and the first conductive layer 13 provided on the substrate 10 are used as wiring for forming a circuit in a region on the substrate 10 other than the region where the MIM capacitor 2 is provided.

As the first conductive layer 13 for wiring, for example, Cu, Ni, Cr, Pd, Au, Rh, or Ir is used. In consideration of use as a circuit, the first conductive layer 13 for wiring is desirably made of Cu because it has good electrical conductivity and is inexpensive. The first conductive layer 13 for wiring is formed by an electrolytic plating method using the first seed layer 12 for power supply.

The thickness of the first conductive layer 13 for wiring is desirably 3 μm or more and 30 μm or less. In a case where the thickness is less than 3 μm, there is a possibility that a circuit disappears due to etching processing after the first conductive layer 13 is formed. In addition, there is a risk that the connection reliability and electrical conductivity of the circuit are reduced. In a case where the thickness is larger than 30 μm, it is necessary to form a resist layer having a thickness of 30 μm or more, and the manufacturing cost increases. Furthermore, since resist resolution is reduced, it is difficult to form fine wiring with a pitch of 30 μm or less. The thickness of the first conductive layer 13 for wiring is more desirably 5 μm or more and 25 μm or less. The thickness is more preferably 10 μm or more and 20 μm or less.

(First Insulating Layer 15)

The first insulating layer 15 as a dielectric layer is made of, for example, aluminum oxide, silicon oxide, silicon nitride, tantalum oxide, titanium oxide, calcium titanate, barium titanate, or strontium titanate from the viewpoint of insulating properties and relative permittivity.

The thickness of the first insulating layer 15 is desirably 10 nm or more and 5 μm or less. In a case where the thickness of the first insulating layer 15 is less than 10 nm, insulating properties cannot be maintained, and a function as a capacitor is not exhibited. In a case where the thickness of the first insulating layer 15 is more than 5 μm, not only the film formation time is too long and mass productivity is poor, but also it takes more time in the step of removing unnecessary portions. The thickness of the first insulating layer 15 is more desirably 50 nm or more and 1 μm or less.

The detailed configuration of the first insulating layer 15 will be described later.

(Second Seed Layer 17)

The second seed layer 17 functions as a power supply layer for electroplating in the step of forming the second conductive layer 18 by a semi-additive method.

As the second seed layer 17, for example, a simple substance of Cu, Ni, Al, Ti, Cr, Mo, W, Ta, Au, Ir, Ru, Pd, Pt, AlSi, AlSiCu, AlCu, NiFe, or a Cu alloy, or a stack of a plurality of these is used. The second seed layer 17 is desirably made of Cu because an unnecessary portion can be easily etched.

The thickness of the second seed layer 17 is desirably 50 nm or more and 5 μm or less. In a case where the thickness of the second seed layer 17 is less than 50 nm, a conduction failure may occur in the subsequent electrolytic plating step. In a case where the thickness of the second seed layer 17 is larger than 5 μm, it takes time to remove the second seed layer 17 by etching. The thickness of the second seed layer 17 is more desirably 100 nm or more and 500 nm or less.

(Second Conductive Layer 18)

The second conductive layer 18 as the upper electrode is made of, for example, Cu, Ni, Cr, Pd, Au, Rh, or Ir. The second conductive layer 18 is desirably made of Cu because it has good electrical conductivity and is inexpensive. The second conductive layer 18 is formed by an electrolytic plating method using the second seed layer 17 for power supply.

The thickness of the second conductive layer 18 is desirably 3 μm or more and 30 μm or less. In a case where the thickness is less than 3 μm, there is a possibility that the circuit disappears due to etching processing after the second conductive layer 18 is formed. In addition, there is a risk that connection reliability and electrical conductivity of the circuit are lowered. In a case where the thickness is larger than 30 μm, it is necessary to form a resist layer having a thickness of 30 μm or more, which requires manufacturing cost. Furthermore, since resist resolution is reduced, it is difficult to form fine wiring with a pitch of 30 μm or less. The thickness of the second conductive layer 18 is more desirably 5 μm or more and 25 μm or less. The thickness is more preferably 10 μm or more and 20 μm or less.

(Second Insulating Layer 19)

The second insulating layer 19 covers the upper surface of the substrate 10 and the MIM capacitor 2. That is, the second insulating layer 19 covers the upper surface of the substrate 10, the adhesion layer 11, the first seed layer 12, the first conductive layer 13, the lower adhesion layer 14, the first insulating layer 15, the upper adhesion layer 16, and the second conductive layer 18. In the second insulating layer 19, via holes (through-holes) may be provided at positions of the first conductive layer 13 and the second conductive layer 18.

The second insulating layer 19 is desirably made of an insulating resin. The components of the insulating resin, the blending ratio of each component, and the method for producing the insulating resin are not particularly limited. Examples of the second insulating layer 19 include epoxy resin, polyimide, maleimide resin, polyethylene terephthalate, polyphenylene oxide, liquid crystal polymer, composite materials thereof, photosensitive polyimide resin, photosensitive polybenzoxazole, and photosensitive acryl-epoxy resin.

The thickness of the second insulating layer 19 is desirably 100 μm or less. The thickness of the second insulating layer 19 is more desirably 10 μm or more and 50 μm or less in consideration of ease of a process of forming the via holes in the second insulating layer 19 and handling properties at the time of manufacturing.

<1-2> Detailed Configuration of First Conductive Layer 13 and First Insulating Layer 15

Next, detailed configurations of the first conductive layer 13 and the first insulating layer 15 will be described. FIG. 2 is a plan view of the first conductive layer 13, the first insulating layer 15, and the second conductive layer 18. FIG. 3 is a partial cross-sectional view taken along line I-I' of FIG. 2. FIG. 4 is a diagram illustrating dimensions of an end region of the first insulating layer 15. In the example shown in FIG. 3, the lower adhesion layer 14 and the upper adhesion layer 16 are not provided.

Each of the first conductive layer 13, the first insulating layer 15, and the second conductive layer 18 has, for example, a quadrangular planar shape. FIG. 2 shows an example in which the planar shape of each of the first conductive layer 13, the first insulating layer 15, and the second conductive layer 18 is a square. An area of the first insulating layer 15 is smaller than an area of the first conductive layer 13. An area of the second conductive layer 18 is smaller than the area of the first insulating layer 15.

In plan view, a region of the first insulating layer 15 not overlapping the second conductive layer 18 includes a first region 15A surrounding the second conductive layer 18 and a second region 15B outside the first region 15A. The second region 15B is an end region of the first insulating layer 15.

In FIG. 4, a position A is an end of a lower surface of the first insulating layer 15, that is, an end of the second region 15B. A position B is an end of the upper surface of the first insulating layer 15. A position C is an end of the first region 15A, that is, a boundary between the first region 15A and the second region 15B. A width a is a width of the upper surface of the second region 15B. A thickness b is the thickness of the second region 15B, and is the thickness of the end of the upper surface of the second region 15B in the present embodiment. An upper surface of the second region 15B is inclined such that the thickness becomes thinner toward the outside. A thickness c is the thickness of the first region 15A. The thickness c of the first region 15A is substantially constant. A central region of the first insulating layer 15 overlapping the second conductive layer 18 also has the thickness c. An angle f is an angle formed by a bottom surface of the first insulating layer 15 and a side wall (the side surface of the second region 15B). That is, the angle f is an angle of a sidewall of the first insulating layer 15.

A surface roughness of the second region 15B of the first insulating layer 15 is set to be larger than that of the first region 15A of the first insulating layer 15. The thickness b of the second region 15B is set to be smaller than the thickness c of the first region 15A. In the present specification, the surface roughness corresponds to an arithmetic mean roughness Ra. The arithmetic mean roughness Ra conforms to the definition of JIS standard "JIS B 0601: 2001".

It is necessary to ensure adhesion at the interface between the first insulating layer 15 and the second insulating layer 19, but there is a possibility that peeling occurs at the interface between the first insulating layer 15 and the second insulating layer 19 due to generation of voids at the interface due to insufficient fluidity of the resin at the time of forming the insulating resin layer (second insulating layer 19), shortage of a contact area between the first insulating layer 15 and the second insulating layer 19, and the like. In addition, when the MIM capacitor 2 is energized, a leakage current is generated from the upper electrode to the lower electrode through the upper surface and the side surface of the first insulating layer 15, and there is a possibility that withstand power characteristics of the MIM capacitor 2 are deteriorated.

In the present embodiment, since the surface roughness of the second region 15B is larger than that of the first region 15A, a surface area of the second region 15B can be increased. As a result, the fluidity of the resin during formation of the insulating resin layer is improved, and generation of voids at the interface can be suppressed. In addition, with an increase in the contact area between the first insulating layer 15 and the second insulating layer 19, the adhesion of the interface between the first insulating layer 15 and the second insulating layer 19 is improved, and peeling can be suppressed. In addition, since the surface area of the second region 15B increases, a passing distance between the upper surface and the side surface of the first insulating layer 15 between the upper electrode and the lower electrode increases when the MIM capacitor 2 is energized, so that the leakage current can be suppressed, and the withstand power characteristics of the MIM capacitor 2 can be improved.

In addition, since the thickness b of the second region 15B is smaller than the thickness c of the first region 15A, the upper surface of the second region 15B has an inclination. As a result, a fluidity of the resin at the time of forming the insulating resin layer is improved, and generation of voids at the interface between the first insulating layer 15 and the second insulating layer 19 can be suppressed. Therefore, the adhesion of the interface between the first insulating layer 15 and the second insulating layer 19 is improved, and peeling can be suppressed. In addition, since the upper surface of the second region 15B has an inclination, the surface area of the second region 15B can be increased as compared with a case where there is no inclination. As a result, the adhesion of the interface between the first insulating layer 15 and the second insulating layer 19 is improved, and peeling can be suppressed. In addition, when the MIM capacitor 2 is energized, the leakage current can be suppressed, and the withstand power characteristics of the MIM capacitor 2 can be improved.

The surface roughness of the second region 15B is desirably 2.4 nm or more and 400 nm or less. Within this range, the above-described effect can be achieved. In a case where the surface roughness of the second region 15B is less than 2.4 nm, the adhesion of the interface between the first insulating layer 15 and the second insulating layer 19 becomes insufficient. In a case where the surface roughness of the second region 15B is more than 400 nm, the fluidity of the resin during formation of the insulating resin layer conversely decreases, and voids are likely to be generated at the interface.

The ratio of the surface roughness of the second region 15B to the surface roughness of the first region 15A is desirably 1.2 or more and 10 or less. Within this range, the above-described effect can be achieved. In a case where the ratio of the surface roughness is less than 1.2, the adhesion of the interface between the first insulating layer 15 and the second insulating layer 19 becomes insufficient. In a case where the ratio of the surface roughness is more than 10, the fluidity of the resin during formation of the insulating resin layer conversely decreases, and voids are likely to be generated at the interface.

A ratio of the thickness b of the second region 15B to the thickness c of the first region 15A is desirably 0.6 or more. Within this range, the above-described effect can be achieved. In a case where the thickness ratio is less than 0.6, the second region 15B is excessively inclined, the strength of the first insulating layer 15 decreases, and there is a possibility that cracking of the first insulating layer 15 occurs. As illustrated in FIG. 2, the width a is the width of the side (linear portion) of the second region 15B. The width a' is a width of the four corners of the second region 15B. The width a of the side of the second region 15B is desirably 1 µm or more and 10 µm or less. A width a' of the four corners of the second region 15B is set to be larger than the width a of the side.

At the four corners of the first insulating layer 15, stress generated at the interface between the first insulating layer 15 and the second insulating layer 19 increases, so that peeling is more likely to occur than at the four sides of the first insulating layer 15. In addition, when stress concentrates on the four corners of the first insulating layer 15, there is also a possibility that a crack occurs in the first insulating layer 15.

In the present embodiment, since the width a' of the four corners of the second region 15B is larger than the width a of the side, the surface area of the four corners of the second region 15B can be increased more than the surface area of the side, and a contact area between the first insulating layer 15 and the second insulating layer 19 can be increased at the four corners of the second region 15B. As a result, the adhesion of the interface between the first insulating layer 15 and the second insulating layer 19 is improved, and peeling at the four corners of the first insulating layer 15 can be suppressed. Furthermore, since the adhesion of the interface is improved, the stress generated at the four corners of the first insulating layer 15 can be resisted, and the crack of the first insulating layer 15 can also be suppressed.

In addition, the width a of the side of the second region 15B is set to the range of 1 µm or more and 10 µm or less, the above-described effect can be achieved. In a case where the width a is less than 1 µm, the adhesion of the interface between the first insulating layer 15 and the second insulating layer 19 becomes insufficient. In a case where the width a is larger than 10 μm, the second region 15B having a large surface roughness becomes close to the upper electrode, the thickness of the first insulating layer 15 around the upper electrode becomes non-uniform, and the accuracy of capacitance decreases.

Next, in the upper surface of the first insulating layer 15, a region (including the first region 15A) inside the second region 15B is set to have surface roughness smaller than that of the second region 15B. The lower surface of the first insulating layer 15 is set to have surface roughness smaller than that of the second region 15B.

In a case where the roughness of the interface between the upper electrode and the lower electrode of the MIM capacitor and the first insulating layer 15 is large, the parasitic resistance of the MIM capacitor increases, and the characteristics such as the Q value of the MIM capacitor may be deteriorated.

In the present embodiment, a region inside the second region 15B on the upper surface of the first insulating layer 15 has a surface roughness smaller than that of the second region 15B. The lower surface of the first insulating layer 15 has a surface roughness smaller than that of the second region 15B. As a result, the roughness of the interface between the upper electrode and the lower electrode and the first insulating layer 15 can be maintained more smoothly. Therefore, an increase in parasitic resistance of the MIM capacitor 2 can be suppressed, and deterioration in characteristics such as a Q factor of the MIM capacitor 2 can be suppressed.

The surface roughness between the region inside the second region 15B in the upper surface of the first insulating layer 15 and the lower surface of the first insulating layer 15 is desirably 5 nm or more and 50 nm or less. Within this range, the above-described effect can be achieved. In a case where the surface roughness is less than 5 nm, the adhesion between the first insulating layer 15 and the upper electrode and the lower electrode becomes insufficient. In a case where the surface roughness is larger than 50 nm, the parasitic resistance of the MIM capacitor 2 increases, and the characteristics such as the Q value of the MIM capacitor 2 deteriorate.

Next, the ratio of the surface roughness of the second region 15B to the surface roughness of the upper surface of the first insulating layer 15 inside the second region 15B and the ratio of the surface roughness of the second region 15B to the surface roughness of the lower surface of the first insulating layer 15 are each desirably 0.048 or more and 80 or less. Within this range, the above-described effect can be achieved. In a case where the ratio of the surface roughness is less than 0.048, the adhesion between the first insulating layer 15 and the upper electrode and the lower electrode becomes insufficient. In a case where the surface roughness ratio is larger than 80, the parasitic resistance of the MIM capacitor 2 increases, and the characteristics such as the Q value of the MIM capacitor 2 deteriorate.

In addition, as the thickness c of the first insulating layer 15 increases, the surface roughness of a region on the inner side of the second region 15B in the upper surface of the first insulating layer 15 tends to decrease. Since the thickness c of the first region 15A is larger than the thickness b of the second region 15B, the surface roughness of the region of the first insulating layer 15 in contact with the upper electrode decreases. As a result, interface resistance between the upper electrode and the first insulating layer 15 at the time of voltage application can be reduced, and characteristics such as a Q value of the MIM capacitor 2 can be improved.

Next, the side wall (that is, the side surface of the second region 15B) of the first insulating layer 15 is configured to have a forward tapered shape.

In a step of forming the second seed layer 17 on the first insulating layer 15, if a cross-sectional shape of the sidewall of the first insulating layer 15 is perpendicular to a film surface or has a reverse tapered shape, an attachment property of the second seed layer 17 to the sidewall of the first insulating layer 15 is deteriorated, the second seed layer 17 does not function as a feeding layer for electroplating, the upper electrode is not appropriately formed, and product workability may be deteriorated.

With formation of the side wall of the first insulating layer 15 in a forward tapered shape, the fluidity of the resin at the time of forming the insulating resin layer is improved, and generation of voids and leakage current at the interface can be suppressed. Furthermore, in a step of forming second seed layer 17 on first insulating layer 15, the attachment property of the second seed layer 17 to the side wall of first insulating layer 15 is improved, and the second seed layer 17 functions as a power supply layer for electroplating. Therefore, the upper electrode is appropriately formed, and product workability is improved.

Specifically, the forward tapered shape of the sidewall of the first insulating layer 15 indicates that an end A of the lower surface of the first insulating layer 15 is outside an end B of the upper surface of the first insulating layer 15 in a cross-sectional view. The angle f of the side wall of the first insulating layer 15 is desirably 60° or more and 85° or less. Within this range, the above-described effect can be achieved. In a case where the angle f is larger than 85°, the attachment property of the second seed layer 17 to the side wall of the first insulating layer 15 becomes insufficient, and the second seed layer 17 may not function as a power supply layer for electroplating. In a case where the angle f is less than 60°, there is a possibility that the side wall is excessively inclined, a strength of the first insulating layer 15 is reduced, and the first insulating layer 15 is cracked.

<1-3> Configuration of Side Etching Portion 20 of First Conductive Layer 13

Next, a specific configuration of the side etching portion 20 of the first conductive layer 13 will be described.

FIG. 5 is a partial cross-sectional view mainly illustrating a first conductive layer 13 and a first insulating layer 15 according to another example. FIG. 6 is a diagram illustrating dimensions of an end region of the first insulating layer 15 and a side etching portion 20. FIGS. 5 and 6 are cross-sectional views taken along line I-I' of FIG. 2. In the example shown in FIG. 6, the lower adhesion layer 14 and the upper adhesion layer 16 are not provided. Configurations and conditions other than the side etching portion 20 are the same as those in the example of FIG. 3 described above.

The first conductive layer 13 includes a side etching portion 20. The side etching portion 20 is a region recessed in the in-plane direction from the end of the first insulating layer 15. The side etching portion 20 is provided in the same quadrangular region as the end of the first insulating layer 15. Specifically, the side etching portion 20 is provided in a region overlapping the second region 15B of the first insulating layer 15 in plan view. A second insulating layer 19 is provided in the side etching portion 20 of the first conductive layer 13.

In FIG. 6, positions A to C, a width a, a thickness b, a thickness c, and an angle f are the same as those in FIG. 3. A position D is an end of the side etching portion 20. A height d is a height (depth in the Z direction) of the side etching portion 20. A length e is a horizontal length of the side etching portion 20.

Although it is necessary to ensure adhesion at an interface between the first conductive layer 13 and the second insulating layer 19, peeling may occur at the interface between the first conductive layer 13 and the second insulating layer 19 due to shortage of the contact area between the first conductive layer 13 and the second insulating layer 19, or the like. In addition, stress concentrates on an interface between the end A of the first insulating layer 15 and the first conductive layer 13, and there is a possibility that a crack occurs in the first insulating layer 15. In addition, at the end of the MIM capacitor 2, since lines of electromagnetic field at the time of voltage application is formed from the upper electrode to the first insulating layer 15 up to the lower electrode, the capacitance of the MIM capacitor 2 increases by the amount of the lines of electromagnetic field reaching the first insulating layer 15, and there is a possibility that the accuracy of the capacitance with respect to the design value decreases. In addition, in a case where the surface roughness of the first conductive layer 13 is large, the electrode area is also increased by the surface roughness, and thus, there is a possibility that the accuracy of the capacitance and the Q value with respect to a design value is lowered. In addition, the higher the frequency of the signal to be applied, the greater the influence of the skin effect, and the larger the surface roughness of the first conductive layer 13, which is also the wiring connected to the lower electrode and the lower electrode, the larger the transmission loss in the lower electrode and the wiring, so that the transmission characteristics may be deteriorated.

In the present embodiment, the surface roughness of the region of the first conductive layer 13 where the side etching portion 20 is formed is set to be larger than that of the region where the side etching portion 20 is not formed. As a result, the surface area of the side etching portion 20 of the first conductive layer 13 can be increased, and a contact area between the first conductive layer 13 and the second insulating layer 19 can be increased. Therefore, adhesion of the interface between the first conductive layer 13 and the second insulating layer 19 is improved, and peeling of the interface can be suppressed. In addition, since the side etching portion 20 is formed in the first conductive layer 13, the fluidity of the resin at the time of forming the insulating resin layer is improved, and generation of voids at the interface of the side etching portion 20 can be suppressed. Therefore, adhesion at the interface is improved, and peeling at the interface between the first conductive layer 13 and the second insulating layer 19 can be suppressed. Further, since stress concentration on the void is eliminated, cracking of the first insulating layer 15 can be suppressed.

In addition, at the end of the MIM capacitor 2, the wraparound of the lines of electromagnetic field to the first insulating layer 15 at the time of voltage application is reduced as compared with the case where the side etching portion 20 is not provided. As a result, an increase in capacitance due to wraparound of the lines of electromagnetic field is suppressed, and the accuracy of the capacitance with respect to the design value can be improved. In addition, since the region of the first conductive layer 13 where the side etching portion 20 is not formed has a surface roughness smaller than that of the region where the side etching portion 20 is formed, a variation in the electrode area due to the surface roughness of the region where the first insulating layer 15 and the first conductive layer 13 are in contact with each other is suppressed, and the accuracy of the electrostatic capacitance and the Q value with respect to the design value can be improved. In addition, a transmission loss in the lower electrode and the wiring is suppressed, and deterioration of transmission characteristics can be suppressed.

In the side etching portion 20 of the first conductive layer 13, fluidity of a filler 21 in the insulating resin is suppressed, and the filler 21 easily stays in the side etching portion 20. The filler 21 is single or continuous in plural and is in contact with the first insulating layer 15 and the first conductive layer 13. The filler 21 relaxes a stress of the first insulating layer 15, and can suppress cracking of the first insulating layer 15. In addition, since the surface area of the first insulating layer 15 can be increased by forming the side etching portion 20, a distance between the upper electrode and the lower electrode via the first insulating layer 15 increases when the MIM capacitor 2 is energized. As a result, the leakage current can be suppressed, and the withstand power characteristics of the MIM capacitor 2 can be improved.

In addition, with formation of the side etching portion 20 in the first conductive layer 13, a portion where stress concentrates in the first insulating layer 15 can be located inside the first insulating layer 15 from the end A of the first insulating layer 15, and the lower surface of the end A of the first insulating layer 15 can be embedded with the second insulating layer 19. As a result, the stress applied to the first insulating layer 15 is reduced, and cracking of the first insulating layer 15 can be suppressed. In addition, when the MIM capacitor 2 is energized, a passing distance between the upper surface and the side surface of the first insulating layer 15 between the upper electrode and the lower electrode increases, so that the leakage current can be suppressed, and the withstand power characteristics of the MIM capacitor 2 can be improved.

Next, the surface roughness of the side etching portion 20 of the first conductive layer 13 is desirably 51 nm or more and 300 nm or less. A surface roughness of a region other than the side etching portion 20 of the first conductive layer 13 is desirably 5 nm or more and 50 nm or less. Since the side etching portion 20 of the first conductive layer 13 has the above-described surface roughness, fluidity of the filler 21 in the insulating resin is suppressed, and the filler 21 easily stays in the side etching portion 20. In a case where the surface roughness is less than 51 nm in the side etching portion 20 and less than 5 nm in the region other than the side etching portion 20, the adhesion of the interface between the first conductive layer 13 and the second insulating layer 19 becomes insufficient, the fluidity of the filler 21 in the insulating resin is improved, and the filler 21 hardly remains in the side etching portion 20. In a case where the surface roughness is larger than 300 nm in the side etching portion 20 and larger than 50 nm in the region other than the side etching portion 20, the fluidity of the filler 21 in the insulating resin decreases, and the filler 21 cannot enter the inside of the side etching portion 20. For this reason, voids are generated in the side etching portion 20, the variation in the electrode area due to the surface roughness of the region where the first insulating layer 15 and the first conductive layer 13 are in contact with each other cannot be sufficiently suppressed, the effect of improving the accuracy with respect to the design values of the electrostatic capacitance and the Q value is lowered, and the effect of suppressing the transmission loss in the lower electrode and the wiring is also lowered.

Next, the ratio of the surface roughness of the side etching portion 20 of the first conductive layer 13 to the surface roughness of the region other than the side etching portion 20 is desirably 1.02 or more and 60 or less. Within this range, the above-described effect can be achieved. In a case where the ratio is less than 1.02, the adhesion of the interface between the first conductive layer 13 and the second insulating layer 19 becomes insufficient, the fluidity of the filler 21 in the insulating resin is improved, and the filler 21 hardly remains in the side etching portion 20. In a case where the ratio is more than 60, the fluidity of the filler 21 in the insulating resin decreases, and the filler 21 cannot enter the inside of the side etching portion 20. For this reason, voids are generated in the side etching portion 20, the variation in the electrode area due to the surface roughness of the region where the first insulating layer 15 and the first conductive layer 13 are in contact with each other cannot be sufficiently suppressed, the effect of improving the accuracy with respect to the design values of the electrostatic capacitance and the Q value is lowered, and the effect of suppressing the transmission loss in the lower electrode and the wiring is also lowered.

From the characteristics of the respective portions described above, if a value obtained by multiplying the ratio of the surface roughness of the side etching portion 20 of the first conductive layer 13 to the surface roughness of the region other than the side etching portion 20, the ratio of the surface roughness of the second region 15B to the surface roughness of the first region 15A, and the ratio of the surface roughness of the second region 15B to the surface roughness of the lower surface of the first insulating layer 15 is in the range of 0.06 or more and 48000 or less, the above effect can be achieved.

Next, a ratio of the thickness c of the first insulating layer 15 to a height d of the side etching portion 20 is desirably 0.07 or more and 20 or less. In addition, the ratio of the thickness c of the first insulating layer 15 to a thickness g of the first seed layer 12 is desirably 0.1 or more and 40 or less. The thickness c of the first insulating layer 15 is desirably 100 nm or more and 2000 nm or less. The thickness g of the first seed layer 12 is desirably 50 nm or more and 1000 nm or less.

Voids may be generated in the second insulating layer 19 of the side etching portion 20, and peeling may occur at interfaces between the first insulating layer 15 and the first conductive layer 13, and the second insulating layer 19. Further, stress may concentrate on the voids, and cracking may occur in the first insulating layer 15. In addition, since stress tends to concentrate on the interface between the end A of the first insulating layer 15 and the first conductive layer 13, the stress is applied to the first insulating layer 15, and there is a possibility that a crack occurs in the first insulating layer 15. In addition, when the MIM capacitor 2 is energized, a leakage current is generated from the upper electrode to the lower electrode through the upper surface and the side surface of the first insulating layer 15, and there is a possibility that withstand power characteristics of the MIM capacitor 2 are deteriorated.

In the present embodiment, since the ratio of the thickness c of the first insulating layer 15 to the height d of the side etching portion 20 and the ratio of the thickness c of the first insulating layer 15 to the thickness g of the first seed layer 12 are within the above ranges, the fluidity of the resin at the time of forming the insulating resin layer in the side etching portion 20 is improved, and generation of voids at the interface of the side etching portion 20 can be suppressed. Therefore, adhesion at the interface is improved, and peeling at the interface between the first insulating layer 15 and the first conductive layer 13 and the second insulating layer 19 can be suppressed. Further, since stress concentration on the void is eliminated, cracking of the first insulating layer 15 can also be suppressed.

In a case where the ratio of the thickness c of the first insulating layer 15 to the height d of the side etching portion 20 is less than 0.07 and the ratio of the thickness c of the first insulating layer 15 to the thickness g of the first seed layer 12 is less than 0.1, the thickness c of the first insulating layer 15 becomes relatively thin, the strength of the first insulating layer 15 decreases, and it becomes difficult to suppress cracking of the first insulating layer 15. In addition, in a case where the ratio of the thickness c of the first insulating layer 15 to the height d of the side etching portion 20 is larger than 20 and the ratio of the thickness c of the first insulating layer 15 to the thickness g of the first seed layer 12 is larger than 40, the height d of the side etching portion 20 becomes relatively small, and the fluidity of the resin at the time of forming the insulating resin layer decreases. Therefore, the resin cannot enter the inside of the side etching portion 20, voids are generated in the side etching portion 20, and peeling occurs at the interfaces between the first insulating layer 15 and the first conductive layer 13 and the second insulating layer 19. In addition, stress concentration on the void makes it difficult to suppress cracking of the first insulating layer 15. Furthermore, when the MIM capacitor 2 is energized, a passing distance between the lower surface of the first insulating layer 15 and the first conductive layer 13 is shortened, and thus, it is difficult to suppress the leakage current.

Next, it is desirable that the side etching portion 20 is formed in the first conductive layer 13, the end D of the side etching portion 20 is formed inside the end A of the first insulating layer 15, and the ratio of the width e and the height d of the side etching portion 20 is 0.03 or more and 50 or less.

The second insulating layer 19 is formed so as to embed the lower electrode, the wiring, the upper electrode, and the first insulating layer 15. In a case where a voltage is applied to the wiring or the upper electrode, an electric field concentrates on the lower electrode or the end of the wiring, and dielectric breakdown or migration occurs in the second insulating layer 19 around the lower electrode or the end of the wiring, which may reduce reliability of the MIM capacitor. In addition, it is necessary to ensure the adhesion at the interface between the first conductive layer 13 and the second insulating layer 19 in the side etching portion 20, but in the surface treatment for imparting the adhesion by the wet method, there is a possibility that peeling occurs at the interface between the first conductive layer 13 and the second insulating layer 19 due to the fact that liquid does not enter the end part of the side etching portion 20. In addition, voids may be generated in the second insulating layer 19 of the side etching portion 20, and peeling may occur at the interfaces between the first insulating layer 15 and the first conductive layer 13, and the second insulating layer 19, and stress may be concentrated on the voids, and cracking may occur in the first insulating layer 15. In addition, since stress tends to concentrate on the interface between the end A of the first insulating layer 15 and the first conductive layer 13, the stress is applied to the first insulating layer 15, and there is a possibility that a crack occurs in the first insulating layer 15.

In the present embodiment, since the ratio of the width e to the height d of the side etching portion 20 is in the range of 0.03 or more and 50 or less, in a case where a voltage is applied to the wiring or the upper electrode, even if an electric field concentrates on the lower electrode or the end of the wiring, since the first insulating layer 15 is formed around the lower electrode or the end of the wiring, the electric field applied to the second insulating layer 19 is relaxed. Therefore, the occurrence of dielectric breakdown and migration to the second insulating layer 19 is suppressed, and the reliability of the MIM capacitor 2 can be improved. In addition, in the surface treatment of imparting the adhesion by the wet method, the liquid penetrates to the end of the side etching portion 20 to impart the adhesion, and peeling at the interface between the first conductive layer 13 and the second insulating layer 19 can be suppressed. In addition, in the side etching portion 20, fluidity of the resin at the time of forming the insulating resin layer is improved, and generation of voids at the interface of the side etching portion 20 can be suppressed, so that adhesion at the interface is improved, and peeling at the interface between the first insulating layer 15 and the first conductive layer 13 and the second insulating layer 19 can be suppressed. In addition, since stress concentration on the void is eliminated, cracking of the first insulating layer 15 can also be suppressed. In addition, a portion where stress concentrates in the first insulating layer 15 can be located inside the first insulating layer 15 from the interface between the end A of the first insulating layer 15 and the first conductive layer 13, and the lower surface of the end A of the first insulating layer 15 can be embedded in the second insulating layer 19. Therefore, stress applied to the first insulating layer 15 is reduced, and cracking of the first insulating layer 15 can be suppressed.

Next, a ratio of the width e to the height d of the side etching portion 20 is desirably 0.03 or more and 50 or less, the width e of the side etching portion 20 is desirably 50 nm or more and 5 μm or less, and the height d of the side etching portion 20 is desirably 100 nm or more and 1500 nm or less. Within this range, the above-described effect can be achieved. In a case where the ratio of the width e to the height d of the side etching portion 20 is less than 0.03, the relaxation of the electric field applied to the second insulating layer 19 is insufficient, the effect of suppressing the occurrence of dielectric breakdown and migration is reduced, the stress applied to the first insulating layer 15 is also insufficient, and it becomes difficult to suppress the crack of the first insulating layer 15. In a case where the ratio of the width e to the height d of the side etching portion 20 is larger than 50, the liquid does not penetrate to the end of the side etching portion 20 in the surface treatment for imparting adhesion by the wet method, and it is difficult to suppress peeling at the interface between the first conductive layer 13 and the second insulating layer 19. In addition, fluidity of the resin at the time of forming the insulating resin layer is also reduced, the resin cannot enter the inside of the side etching portion 20, voids are generated in the side etching portion 20, and peeling occurs at the interfaces between the first insulating layer 15 and the first conductive layer 13, and the second insulating layer 19. In addition, stress concentration on the void makes it difficult to suppress cracking of the first insulating layer 15.

Next, it is desirable that the second insulating layer 19 between the side etching portion 20 of the first conductive layer 13 and the first insulating layer 15 is filled with one or more fillers 21 of ½ or more of the height d of the side etching portion 20.

Since stress tends to concentrate on the interface between the end A of the first insulating layer 15 and the first conductive layer 13, stress is applied to the first insulating layer 15, and there is a possibility that a crack occurs in the first insulating layer 15. In addition, the second insulating layer 19 formed in the side etching portion 20 is related to the parasitic capacitance of the MIM capacitor, and due to the difference in the size of the filler 21 and the content rate of the filler 21 in the side etching portion 20, the dielectric characteristics of the second insulating layer 19 fluctuate locally, and the parasitic capacitance also fluctuates, so that the characteristic accuracy of the MIM capacitor may be lowered.

In the present embodiment, the filler 21 easily stays in the side etching portion 20, and the filler 21 is in contact with the first insulating layer 15 and the first conductive layer 13 singly or continuously in plural. The filler 21 relaxes a stress of the first insulating layer 15, and can suppress cracking of the first insulating layer 15. In addition, since the filler 21 larger than the height d of the side etching portion 20 is not formed in the side etching portion 20, variations in the size and content of the filler 21 in the side etching portion 20 and local variations in dielectric characteristics can be suppressed. As a result, the variation in the parasitic capacitance of the MIM capacitor 2 can be suppressed, and thus the characteristic accuracy of the MIM capacitor 2 can be improved.

Next, the height d of the side etching portion 20 is desirably 100 nm or more and 1500 nm or less, and the size of the filler 21 is desirably 50 nm or more and 750 nm or less. Then, it is desirable that one or more fillers 21 in the above size range be filled in the side etching portion 20. The filler 21 is set within the above size range, the above-described effects can be achieved. In a case where the size of the filler 21 is less than ½ of the height d of the side etching portion 20, the filler 21 is less likely to remain in the side etching portion 20, and the filler 21 is continuous alone or in plural, so that the frequency of being in contact with the first insulating layer 15 and the first conductive layer 13 is reduced. For this reason, it is difficult to alleviate the stress of the first insulating layer 15 and suppress the crack of the first insulating layer 15.

Note that the example including the side etching portion 20 illustrated in FIG. 5 is also applicable as an example of only the configuration of the side etching portion 20 and the second insulating layer 19 of the first conductive layer 13 and the configuration of the filler 21 provided in the side etching portion 20, and the effect related to the side etching portion 20 can be exhibited. In the case of this example, the configuration of the upper surface of the first insulating layer 15 is not particularly limited.

<1-4> Specific Configuration of Wiring Board 1

Next, a specific configuration of the wiring board 1 will be described. FIG. 7 is a cross-sectional view of the wiring board 1 including multilayer wiring.

The MIM capacitor 2 is provided on the upper surface of the substrate 10. The configuration of the MIM capacitor 2 is as illustrated in FIG. 1. The second insulating layer 19 is provided around the MIM capacitor 2.

A plurality of wirings 22 is provided on the substrate 10. Each wiring 22 has, for example, the same configuration as the lower electrode of the MIM capacitor 2. In the present embodiment, the wiring 22 is configured by laminating the adhesion layer 11, the first seed layer 12, and the first conductive layer 13.

The substrate 10 is provided with a plurality of through-holes 23. Each through-hole 23 penetrates the upper surface and the lower surface of the substrate 10.

An in-through-hole conductive layer 24 is provided on an inner wall of the through-hole 23. The in-through-hole conductive layer 24 is configured to electrically connect the wiring arranged on the upper surface of the substrate 10 and the wiring arranged on the lower surface of the substrate 10. The in-through-hole conductive layer 24 has, for example, the same configuration as the wiring 22. In the present embodiment, the in-through-hole conductive layer 24 is configured by laminating the adhesion layer 11, the first seed layer 12, and the first conductive layer 13.

In the second insulating layer 19, a via hole 25 for exposing the wiring 22 and the upper electrode of the MIM capacitor 2 is provided. A seed layer 26 is provided in the via hole 25. A via 27 configured to embed the via hole 25 is provided on the seed layer 26. The seed layer 26 can be made of the same material as the first seed layer 12. The same material as that of the first conductive layer 13 can be used for the via 27.

A plurality of seed layers 26 are provided on the second insulating layer 19. A plurality of wirings 28 are provided on the plurality of seed layers 26 on the second insulating layer 19. The wiring 28 can be made of the same material as that of the first conductive layer 13. A part of the plurality of wirings 28 is electrically connected to the via 27.

An insulating layer 29 is provided on the second insulating layer 19 and the plurality of wirings 28. The same material as that of the second insulating layer 19 can be used for the insulating layer 29.

In the insulating layer 29, a via hole 30 for exposing a part of the plurality of wirings 28 is provided. Although not illustrated, a via, a wiring, and an insulating layer may be further formed, and a multilayer wiring layer may be further formed. The plurality of wirings of the uppermost layer may include a pad portion. The pad portion may be formed as an external connection terminal.

The configuration on the lower surface side of the substrate 10 is also the same as the configuration on the upper surface side. The MIM capacitor 2, the second insulating layer 19, the wiring 22, and the like are also provided on the lower surface of the substrate 10.

In the wiring board 1 of the present embodiment, the laminated conductor circuit layer (including MIM capacitor 2 and wirings 22 and 27), the external connection terminal, and the solder ball may be provided only on one surface, and as another example, the laminated conductor circuit layer may be provided on both surfaces. Further, a semiconductor chip and a chip component may be mounted on the wiring board 1.

<1-5> Manufacturing Method

Next, a method for manufacturing the wiring board 1 will be described. Hereinafter, steps 1 to 17 in the manufacturing method will be described with reference to FIGS. 8 to 19 and the like. In the following description of the manufacturing method, steps of forming the MIM capacitor and the wiring formed on the upper surface of the substrate 10 will be mainly described. In a case where the MIM capacitor and the wiring are further formed on the lower surface of the substrate 10, they can be formed using the same manufacturing process as the MIM capacitor and the wiring formed on the upper surface of the substrate 10.

(Step 1)

The substrate 10 is made of a glass substrate. The substrate 10 can have a through-hole penetrating from the upper surface to the lower surface of the substrate 10. The cross-sectional shape and diameter of the through-hole may be, for example, a shape in which a diameter of a central portion is narrower than a top diameter and a bottom diameter of the through-hole, or a shape in which the bottom diameter is smaller than the top diameter. Further, a shape in which the diameter of the central portion is larger than the top diameter and the bottom diameter of the through-hole may be used.

(Step 2)

Next, as illustrated in FIG. 8, the adhesion layer 11 and the first seed layer 12 are formed on the upper surface of the substrate 10. In a case where a through-hole is formed in the substrate 10, the adhesion layer 11 and the first seed layer 12 are also formed in the through-hole. The adhesion layer 11 and the first seed layer 12 function as a feeding layer for electroplating in a wiring forming step in a semi-additive method.

Specifically, a titanium layer is formed as the adhesion layer 11 on the upper surface of the substrate 10 by a sputtering method, and then a copper layer is formed as the first seed layer 12 by a sputtering method. Thereafter, it is desirable to form a metal layer by electroless plating. When the titanium layer and the copper layer are formed only by the sputtering method, the metal layer may not be uniformly formed on the inner wall of the through-hole. Therefore, it is desirable to enhance the metal layer by an electroless plating method. Examples of the electroless plating layer include electroless copper plating and electroless nickel plating, but electroless nickel plating is desirable because adhesion to glass, a titanium layer, and a copper layer is good.

If the nickel plating layer is too thick, it may be difficult to form fine wiring. In addition, adhesion may decrease due to an increase in stress of the film. Therefore, a thickness of the nickel plating layer is desirably 1 μm or less. The thickness is more preferably 0.5 μm or less, still more preferably 0.3 μm or less.

The nickel plating layer may contain phosphorus, which is a eutectoid derived from a reducing agent, or sulfur, lead, bismuth, or the like contained in the electroless nickel plating solution. Through the above steps, a glass substrate in which a seed layer is also formed in a through-hole is obtained.

(Step 3)

Subsequently, a resist layer 31 having a desired resist pattern is formed on the first seed layer 12. In the method for forming the resist layer 31, first, the resist layer 31 is formed on the entire surface of the first seed layer 12. Examples of the resist layer 31 include a negative dry film resist, a negative liquid resist, and a positive liquid resist, but it is desirable that the resist layer is a negative photoresist because formation of the resist layer is simple and inexpensive.

(Step 4)

Subsequently, a resist pattern for forming a desired conductor circuit layer is formed on the resist layer 31 by a known photolithography method. That is, the resist pattern of the resist layer 31 is aligned such that a portion where the conductor circuit layer is formed is exposed, and exposure and development processing are performed to pattern the resist layer 31. The thickness of the resist layer 31 also depends on the thickness of the conductor circuit layer, but is desirably 5 μm or more and 25 μm or less. In a case where the thickness is less than 5 μm, the electrolytic plating layer to be the conductor circuit layer cannot be increased to 5 μm or more, and the connection reliability of the circuit may be deteriorated. In a case where the thickness is larger than 25 μm, it is difficult to form fine wiring with a pitch of 30 μm or less. In this way, the substrate on which the resist pattern is formed is obtained.

(Step 5)

Subsequently, as illustrated in FIG. 9, power is supplied to the first seed layer 12, and the first seed layer 12 is immersed in a plating solution to form an electrolytic plating layer which is the first conductive layer 13 on the upper surface of the first seed layer 12 on which the resist layer 31 is not formed.

(Step 6)

Subsequently, as illustrated in FIG. 10, the resist layer 31 is removed to expose the first seed layer 12. The method for removing the resist layer 31 is not limited to any specific method, but can be peeled and removed by, for example, an alkaline aqueous solution.

(Step 7)

Subsequently, as illustrated in FIG. 11, the lower adhesion layer 14, the first insulating layer 15, the upper adhesion layer 16, and the second seed layer 17 are sequentially formed on the first conductive layer 13 and the first seed layer 12. Examples of the method for forming the above layer include a vacuum vapor deposition method, a sputtering method, an ion plating method, a molecular beam epitaxy (MBE) method, a laser vibration method, and a CVD method.

The lower adhesion layer 14 which is a lower layer of the first insulating layer 15 has a function of improving adhesion between the first insulating layer 15 and the first conductive layer 13. However, in a case where adhesion between the first insulating layer 15 and the first conductive layer 13 is sufficient, the lower adhesion layer 14 may be omitted.

In the present embodiment, after the formation of the first conductive layer 13, the first insulating layer 15, the second seed layer 17, and the like are formed without etching the first seed layer 12. Therefore, when the second seed layer 17 is formed, it is possible to suppress an abnormality in the attachment property of the second seed layer 17. As a result, the second conductive layer 18 can also be stably formed. The second seed layer 17 functions as a power supply layer for forming the upper electrode of the MIM capacitor 2 by a semi-additive method.

(Step 8)

Subsequently, as illustrated in FIG. 12, a resist layer 32 that covers a region other than the region where the second conductive layer 18 is to be formed is formed on the second seed layer 17. The resist pattern of the resist layer 32 can be formed by the same method as the resist pattern described above. In this step, an opening region of the resist layer 32 is formed so as to be inside the first conductive layer 13 as the lower electrode, and is formed so as to be inside the first conductive layer 13 also in the Y direction except for the portion of the connection wiring to the outside of the MIM capacitor 2.

(Step 9)

Subsequently, power is supplied to the second seed layer 17 by an electrolytic plating method to form the second conductive layer 18 on the second seed layer 17.

(Step 10)

Subsequently, as illustrated in FIG. 13, the resist layer 32 is removed. The resist layer 32 can be peeled and removed by a known method, for example, an alkaline aqueous solution.

(Step 11)

Subsequently, as illustrated in FIG. 14, a pattern of a resist layer 33 is formed on the second seed layer 17 and the second conductive layer 18 so as to surround the second conductive layer 18. The resist pattern of the resist layer 33 can be formed by the same method as the resist pattern described above. In this step, the opening region of the resist layer 33 (the region where the first insulating layer 15 is to be formed) is formed so as to be outside the second conductive layer 18 and inside the first conductive layer 13, and is also formed so as to be inside the first conductive layer 13 except for the portion of the connection wiring to the outside of the MIM capacitor 2 in the Y direction.

(Step 12)

Subsequently, heat treatment is performed on the substrate to be treated on which the resist layer 33 is formed. Through the heat treatment, stress is generated at an interface between the resist layer 33 and the second seed layer 17 due to a difference in linear expansion coefficient between the resist layer 33 and the second seed layer 17, the first insulating layer 15, and the first conductive layer 13.

FIG. 15 is a partial cross-sectional view illustrating a state of the resist layer 33 after the heat treatment. FIG. 15 is a partial cross-sectional view taken along line I-I' in FIG. 2. In the example illustrated in FIG. 15, the lower adhesion layer 14 and the upper adhesion layer 16 are not provided.

As illustrated in FIG. 15, the generated stress is larger than the adhesion force of the interface between the resist layer 33 and the second seed layer 17, so that peeling occurs at the end of the resist layer 33 to form a gap. In addition, since the generated stress is larger at the four corners than at the end of the linear portion of the resist layer 33, peeling is more likely to occur at the four corners. Therefore, a width of the gap is larger at the four corners than at the ends of the linear portions of the resist layer 33.

The heat treatment is desirably performed under conditions of a treatment temperature in a range of 50° C. or more and 200° C. or less and a treatment time in a range of 1 minute or more and 5 minutes or less. As a result, peeling occurs at the end of the resist layer 33, and a gap can be formed. In a case where the treatment temperature is lower than 50° C., stress enough to cause peeling is not generated, and peeling hardly occurs. In a case where the processing temperature is higher than 200° C., the resist layer 33 is softened, a stress that causes peeling is not generated, and peeling hardly occurs.

In a case where the treatment time is less than 1 minute, the width of the second region 15B having a large surface roughness in the first insulating layer 15 is less than 1 μm. In a case where the treatment time is longer than 5 minutes, the width of the second region 15B having large surface roughness is larger than 10 μm, and the region having a large surface roughness is close to the upper electrode. For this reason, the thickness of the first insulating layer 15 around the upper electrode becomes non-uniform, and the accuracy of capacitance decreases.

The method of the heat treatment is not particularly limited, and the heat treatment is performed using a general heating device such as an oven.

(Step 13)

Subsequently, as illustrated in FIG. 16, the second seed layer 17, the upper adhesion layer 16, the first insulating layer 15, and the lower adhesion layer 14 are etched using the resist layer 33 as a mask. Through this etching step, the side surfaces of the second seed layer 17, the upper adhesion layer 16, the first insulating layer 15, and the lower adhesion layer 14 are outside the second conductive layer 18 and inside the first conductive layer 13, respectively.

The removal of the unnecessary portions of the second seed layer 17 and the upper adhesion layer 16 is not limited to being performed in this step 13, and for example, the unnecessary portions of the second seed layer 17 and the upper adhesion layer 16 may be etched using the second conductive layer 18 as a mask before step 11. In this way, an area of the first insulating layer 15 on the outer surface of the MIM capacitor is increased, and a leakage current or the like via the side surface between the upper electrode and the lower electrode of the MIM capacitor can be suppressed.

Figure 17:
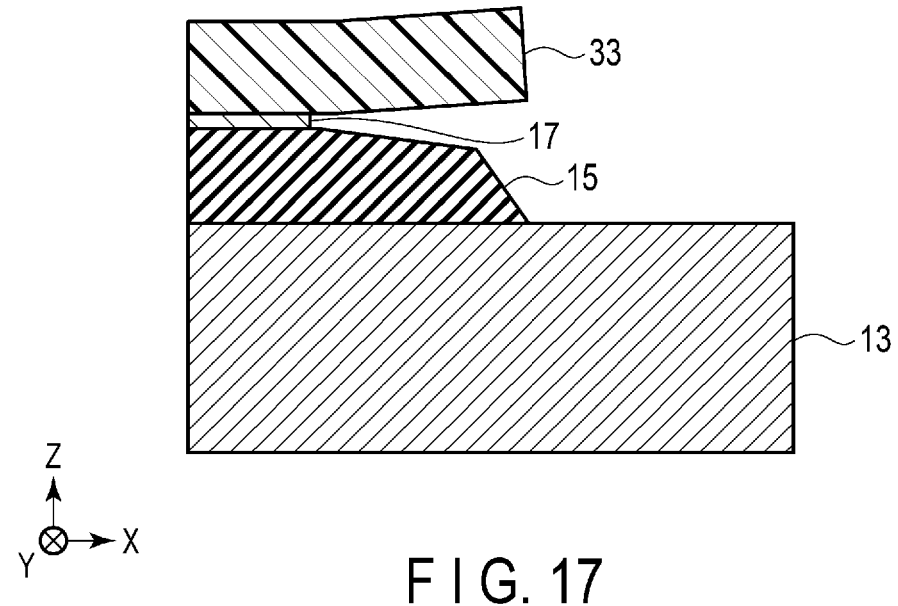
FIG. 17 is a cross-sectional view illustrating the manufacturing process of the wiring board according to the first embodiment.

Here, when etching the first insulating layer 15, it is desirable to perform dry etching. As a result, as illustrated in FIG. 17, slight dry etching processing is performed on a slight gap between the first insulating layer 15 and the resist layer 33. As a result, the upper surface of the second region 15B of the first insulating layer 15 is roughened, the thickness of the second region 15B is reduced, and a forward tapered side wall can be formed.

In addition, as described above, since the width of the gap is larger at the four corners than at the end of the linear portion of the resist layer 33, the region to be subjected to the dry etching process is also larger at the four corners. As a result, in the region where the surface roughness of the upper surface of the first insulating layer 15 is large, the four corners are larger than the ends of the straight portions. (Step 14)

Subsequently, as illustrated in FIG. 18, the resist layer 33 is removed. The resist layer 33 can be peeled and removed by a known method, for example, an alkaline aqueous solution. (Step 15)

Subsequently, as illustrated in FIG. 19, the exposed portion of the first seed layer 12 is removed. In the present embodiment, a titanium layer as the adhesion layer 11, a copper layer as the first seed layer 12, and an electroless nickel layer as the adhesion layer are laminated in this order on the substrate 10. A method of sequentially removing the electroless nickel layer, the copper layer, and the titanium layer by chemical etching can be used. The type of the etching solution is appropriately selected depending on the metal type to be removed, and the removal method is not limited to the method described in the present embodiment.

In a case where the first seed layer 12 and the second seed layer 17 have the same material and the same thickness, and the adhesion layer 11 and the upper adhesion layer 16 have the same material and the same thickness, the exposed portions of the second seed layer 17 and the upper adhesion layer 16 are also etched at the same time in this etching step. In this case, the second conductive layer 18, the second seed layer 17, and the upper adhesion layer 16 are formed to be flush with each other.

In this etching step, the side etching portion 20 can be formed at the interface between the first conductive layer 13 and the end of the first insulating layer 15. In this manner, the MIM capacitor 2 is formed on the substrate 10. (Step 16)

Subsequently, as illustrated in FIG. 1, a second insulating layer 19 is formed on the substrate 10 and the MIM capacitor 2. The second insulating layer 19 can be formed using a known technique such as a vacuum laminator or a roll coater. In this way, the wiring board 1 on which the MIM capacitor 2 is formed is formed. (Step 17)

Subsequently, as illustrated in FIG. 7, a via hole 25 is formed in the second insulating layer 19 to form the via 27 and the wiring 28. Thereafter, the above-described wiring and the insulating resin layer are repeatedly formed to form the wiring board 1 including the multilayer wiring. The multilayer wiring on the wiring board 1 can be formed using a known semi-additive method or subtractive method.

Furthermore, it is also possible to form an external connection terminal after forming the wiring board 1. Further, it is also possible to form a solder ball on the external connection terminal.

<1-6> Effects of First Embodiment

In the first embodiment, the surface roughness of the second region 15B of the first insulating layer 15 is set to be larger than the surface roughness of the first region 15A. Therefore, the surface area of the second region 15B can be increased, and the contact area between the first insulating layer 15 and the second insulating layer 19 can be increased. As a result, adhesion at the interface between the first insulating layer 15 and the second insulating layer 19 is improved, and peeling at the interface between the first insulating layer 15 and the second insulating layer 19 can be suppressed. In addition, since the surface area of the second region 15B increases, a passing distance between the upper surface and the side surface of the first insulating layer 15 between the upper electrode and the lower electrode increases when the MIM capacitor 2 is energized, so that the leakage current can be suppressed, and the withstand power characteristics of the MIM capacitor 2 can be improved.

In addition, since the thickness b of the second region 15B is set to be smaller than the thickness c of the first region 15A, a structure is obtained in which the upper surface of the second region 15B has an inclination. As a result, when the insulating resin layer as the second insulating layer 19 is formed, the fluidity of the resin is improved, and generation of voids at the interface between the first insulating layer 15 and the second insulating layer 19 can be suppressed.

In addition, the width a' of each of the four corners of the second region 15B of the first insulating layer 15 is set to be larger than the width a of the side. As a result, the contact area between the first insulating layer 15 and the second insulating layer 19 can be increased at the four corners of the second region 15B. As a result, adhesion at the interface between the first insulating layer 15 and the second insulating layer 19 is improved, and peeling at the interface between the first insulating layer 15 and the second insulating layer 19 can be suppressed.

In addition, the first conductive layer 13 includes a side etching portion 20 provided under the end of the first insulating layer 15. A surface roughness of a region of the first conductive layer 13 where the side etching portion 20 is formed is set to be larger than a surface roughness of a region where the side etching portion 20 is not formed. As a result, adhesion of the interface between the first conductive layer 13 and the second insulating layer 19 is improved, and peeling of the interface can be suppressed. In addition, when the second insulating layer 19 is formed, the fluidity of the resin of the side etching portion 20 is improved, and generation of voids at the interface of the side etching portion 20 can be suppressed.

In addition, the side etching portion 20 is formed in the first conductive layer 13, so that the end of the first insulating layer 15 can be embedded in the second insulating layer 19. As a result, the stress applied to the first insulating layer 15 is reduced, and cracking of the first insulating layer 15 can be suppressed.

In addition, the filler 21 included in the second insulating layer 19 is provided in the side etching portion 20. The filler 21 relieves stress of the first insulating layer 15, and can suppress cracking of the first insulating layer 15.

Further, according to the first embodiment, the electrical characteristics of the MIM capacitor 2 can be improved.

<2> Second Embodiment

A second embodiment is another method for manufacturing a wiring board 1.

<2-1> Manufacturing Method

Hereinafter, a manufacturing method according to the second embodiment will be described with reference to FIGS. 20 to 28 and the like.

In the second embodiment, steps 1 to 6 are the same as those in the first embodiment, and thus description of steps 1 to 6 is omitted. In the second embodiment, step 18 described below is continued after step 6 of the first embodiment shown in FIG. 7.

(Step 18)

As illustrated in FIG. 20, a first seed layer 12 and an adhesion layer 11 are removed using a first conductive layer 13 as a mask. In the present embodiment, a titanium layer as the adhesion layer 11, a copper layer as the first seed layer 12, and an electroless nickel layer as the adhesion layer are laminated in this order on the substrate 10. The first seed layer 12 and the adhesion layer 11 can be removed by a method of sequentially removing the electroless nickel layer, the copper layer, and the titanium layer by chemical etching. The type of the etching solution is appropriately selected depending on the metal type to be removed, and the removal method is not limited to the method described in the present embodiment.

(Step 19)

Subsequently, as illustrated in FIG. 21, the lower adhesion layer 14 and the first insulating layer 15 are sequentially formed on the first conductive layer 13 and the substrate 10. Examples of the method for forming the above layer include a vacuum vapor deposition method, a sputtering method, an ion plating method, an MBE method, a laser vibration method, and a CVD method.

The lower adhesion layer 14 which is a lower layer of the first insulating layer 15 has a function of improving adhesion between the first insulating layer 15 and the first conductive layer 13. However, in a case where adhesion between the first insulating layer 15 and the first conductive layer 13 is sufficient, the lower adhesion layer 14 may be omitted.

(Step 20)

Subsequently, as illustrated in FIG. 22, a resist layer 34 covering a region where the first insulating layer 15 is to be formed is formed on the first insulating layer 15. The resist pattern of the resist layer 34 can be formed by the same method as the resist pattern described above. In this step, an opening region of the resist layer 34 is formed so as to be inside the first conductive layer 13 as the lower electrode, and is formed so as to be inside the first conductive layer 13 also in the Y direction except for the portion of the connection wiring to the outside of the MIM capacitor 2.

(Step 21)

Subsequently, heat treatment is performed on the substrate to be treated on which a resist layer 34 is formed. Through the heat treatment, stress is generated at an interface between the resist layer 34 and the first insulating layer 15 due to a difference in linear expansion coefficient between the resist layer 34 and the first insulating layer 15 and between the resist layer 34 and the first conductive layer 13.

FIG. 23 is a partial cross-sectional view illustrating a state of the resist layer 34 after the heat treatment. FIG. 23 is a partial cross-sectional view taken along line I-I' in FIG. 2. In the example illustrated in FIG. 23, the lower adhesion layer 14 and the upper adhesion layer 16 are not provided.

As illustrated in FIG. 23, the generated stress is larger than the adhesion force of the interface between the resist layer 34 and the first insulating layer 15, so that peeling occurs at the end of the resist layer 34 to form a gap. In addition, since the generated stress is larger at the four corners than at the end of the linear portion of the resist layer 34, peeling is more likely to occur at the four corners. Therefore, a width of the gap is larger at the four corners than at the ends of the linear portions of the resist layer 34.

The heat treatment is desirably performed under conditions of a treatment temperature in a range of 50° C. or more and 200° C. or less and a treatment time in a range of 1 minute or more and 5 minutes or less. As a result, peeling occurs at the end of the resist layer 34, and a gap can be formed. In a case where the treatment temperature is lower than 50° C., stress enough to cause peeling is not generated, and peeling hardly occurs. In a case where the processing temperature is higher than 200° C., the resist layer 34 is softened, a stress that causes peeling is not generated, and peeling hardly occurs.

In a case where the treatment time is less than 1 minute, the width of the second region 15B having a large surface roughness in the first insulating layer 15 is less than 1 μm. In a case where the treatment time is longer than 5 minutes, the width of the second region 15B having large surface roughness is larger than 10 μm, and the region having a large surface roughness is close to the upper electrode. For this reason, the thickness of the first insulating layer 15 around the upper electrode becomes non-uniform, and the accuracy of capacitance decreases.

The method of the heat treatment is not particularly limited, and the heat treatment is performed using a general heating device such as an oven.

(Step 22)

Subsequently, as illustrated in FIG. 24, unnecessary portions of the first insulating layer 15 and the lower adhesion layer 14 are removed using the resist layer 34 as a mask. For the removal of the first insulating layer 15 and the lower adhesion layer 14, a chemical etching method or a dry etching method can be used, and any known method can be used. In addition, a different removal method may be used for each layer, or the same removal method may be used for all layers.

As described above, since the resist layer 34 is formed inside the first conductive layer 13 (lower electrode), even if an unnecessary portion is removed using the resist layer 34 as a mask, the first insulating layer 15 remains only inside the first conductive layer 13.

Here, when etching the first insulating layer 15, it is desirable to perform dry etching. As a result, as illustrated in FIG. 25, slight dry etching processing is performed on a slight gap between the first insulating layer 15 and the resist layer 34. As a result, the upper surface of the second region 15B of the first insulating layer 15 is roughened, the thickness of the second region 15B is reduced, and a forward tapered side wall can be formed.

In addition, as described above, since the width of the gap is larger at the four corners than at the end of the linear portion of the resist layer 34, the region to be subjected to the dry etching process is also larger at the four corners. As a result, in the region where the surface roughness of the upper surface of the first insulating layer 15 is large, the four corners are larger than the ends of the straight portions.
(Step 23)

Subsequently, the resist layer 34 is removed. The resist layer 34 can be removed by a known method, for example, removal and peeling with an alkaline aqueous solution.
(Step 24)

Subsequently, as illustrated in FIG. 26, the upper adhesion layer 16 and the second seed layer 17 are sequentially formed on the substrate 10, the first conductive layer 13, and the first insulating layer 15. Examples of the method for forming the above layer include a vacuum vapor deposition method, a sputtering method, an ion plating method, an MBE method, a laser vibration method, and a CVD method.

The second seed layer 17 functions as a power supply layer for forming the upper electrode of the MIM capacitor 2 by a semi-additive method.
(Step 25)

Subsequently, as illustrated in FIG. 27, a resist layer 35 that covers a region other than the region where the second conductive layer 18 is to be formed is formed on the second seed layer 17. The resist pattern of the resist layer 35 can be formed by the same method as the resist pattern described above. In this step, an opening region of the resist layer 35 is formed so as to be inside the first conductive layer 13 and inside the first insulating layer 15 as the lower electrode, and is formed so as to be inside the first conductive layer 13 and inside the first insulating layer 15 also in the Y direction except for the portion of the connection wiring to the outside of the MIM capacitor 2.
(Step 26)

Subsequently, power is supplied to the second seed layer 17 by an electrolytic plating method to form the second conductive layer 18 on the second seed layer 17.
(Step 27)

Subsequently, as illustrated in FIG. 28, the resist layer 35 is removed. The resist layer 35 can be removed by a known method, for example, removal and peeling with an alkaline aqueous solution.
(Step 28)

Subsequently, as illustrated in FIG. 19, the exposed portions of the second seed layer 17 and the upper adhesion layer 16 are removed using the second conductive layer 18 as a mask. For the removal of the second seed layer 17 and the upper adhesion layer 16, a chemical etching method or a dry etching method can be used, and any known method can be used. Different removal methods may be employed for each layer, or the same removal method may be performed for all layers. The unnecessary portion may be removed using the second conductive layer 18 as a mask, or a resist layer may be formed again and the resist layer may be used as a mask.

In this etching step, the side etching portion 20 can be formed at the interface between the first conductive layer 13 and the end of the first insulating layer 15. In this manner, the MIM capacitor 2 is formed on the substrate 10.
(Step 29)

Subsequently, as illustrated in FIG. 1, a second insulating layer 19 is formed on the substrate 10 and the MIM capacitor 2. The second insulating layer 19 can be formed using a known technique such as a vacuum laminator or a roll coater. In this way, the wiring board 1 on which the MIM capacitor 2 is formed is formed.

The subsequent step is the same as step 17 of the first embodiment.

<2-2> Effects of Second Embodiment

Even in a case where the manufacturing method according to the second embodiment is adopted, the configuration of the wiring board 1 described in the first embodiment can be obtained. Other effects are the same as those of the first embodiment.

<3> Test Results

Hereinafter, tests conducted in connection with the present invention will be described. FIG. 29 is a diagram illustrating a test result of a MIM capacitor.

A test was performed on a MIM capacitor manufactured by adopting the manufacturing method according to the first embodiment and the second embodiment of the present invention (Examples 1 to 3) and a MIM capacitor having no structure of the MIM capacitor of the present embodiment (comparative example). The configurations of Examples 1 to 3 and the comparative example are as follows.

Example 1: Roughness is formed in second region 15B of first insulating layer 15. A side etching portion is not formed in the first conductive layer 13.

Example 2: No roughness is formed in the second region 15B of first insulating layer 15. A side etching portion is formed in the first conductive layer 13.

Example 3: Roughness is formed in the second region 15B of the first insulating layer 15. A side etching portion is formed in the first conductive layer 13.

Comparative Example: No roughness is formed in the second region 15B of the first insulating layer 15. A side etching portion is not formed in the first conductive layer 13.

The comparative tests 1 to 5 will be described below.
(Comparative Test 1)

A comparative test 1 is a test concerning the presence or absence of voids between the first insulating layer 15 and the second insulating layer 19. For each of the examples 1 to 3 and the comparative example, 100 specimens were produced, and cross sections of the specimens were observed. The presence or absence of voids was confirmed by cross-section observation of the specimen, and the void occurrence rate (%) was confirmed.

As shown in FIG. 29, in the present embodiment (examples 1 to 3), generation of voids at the interface between the first insulating layer 15 and the first conductive layer 13 and the interface between the first insulating layer 15 and the second insulating layer 19 could be suppressed.
(Comparative Test 2)

A comparative test 2 is a test on the presence or absence of peeling between the first insulating layer 15 and the second insulating layer 19 after a temperature cycle test (thermal cycle test (TCT)). For each of the examples 1 to 3 and the comparative example, 100 specimens were produced, the specimens were subjected to a temperature cycle test, and the cross sections of the specimens after the temperature cycle test were observed. The presence or absence of peeling between the first insulating layer 15 and the second insulating layer 19 was confirmed by cross-section observation of the specimen, and the peeling occurrence rate (%) was confirmed. In addition, the presence or absence of peeling at the four corners of the first insulating layer 15 was also confirmed. Further, the presence or absence of cracks in the first insulating layer 15 was confirmed, and the crack occurrence rate (%) was confirmed. In the temperature cycle test, changing an ambient temperature of the wiring board in the range of −40° C. or more and +125° C. or less was defined as one cycle, and this was repeated for 1000 cycles.

As shown in FIG. 29, in the present embodiment (examples 1 to 3), peeling of the interface between the first insulating layer 15 and the first conductive layer 13 and the interface between the first insulating layer 15 and the second insulating layer 19 could be suppressed. In the present embodiment, cracking of the first insulating layer 15 can be suppressed. In addition, in the present embodiment, peeling of the four corners of the first insulating layer 15 was not observed.

(Comparative Test 3)

Comparative Test 3 is a test on the presence or absence of linearity between voltage and current in the withstand power test. For each of the examples 1 to 3 and the comparative example, 10 specimens were produced and subjected to a power resistance test. In the withstand power test, power was applied to the MIM capacitor in a range of 4 GHZ, 30 dBm or more and 38 dBm or less. A case where the characteristics of the MIM capacitor could be maintained was determined as "Passed", and a case where the characteristics could not be maintained due to dielectric breakdown or leakage current generated in the MIM capacitor was determined as "Failed".

As shown in FIG. 29, the MIM capacitor of the present embodiment (examples 1 and 3) passed the withstand power test.

(Comparative Test 4)

A comparative test 4 is a test concerning a quality factor. For each of the examples 1 to 3 and the comparative example, 20 specimens were produced, and the Q-value was measured. A capacitance of the MIM capacitor was 1 pF, a measurement frequency was 5 GHZ, and an average value of 20 specimens was calculated.

As illustrated in FIG. 29, the Q factor can be improved by the MIM capacitor of the present embodiment (examples 1 and 3).

(Comparative Test 5)

A comparative test 5 is a test concerning variation (accuracy) in capacitance. For each of the examples 1 to 3 and the comparative example, 20 specimens were produced, and the difference between the actual measurement value and the design value of capacitance was measured. A design value of capacitance of the MIM capacitor was set to 1 pF, a measurement frequency was set to 5 GHz, a difference from the design value was divided by the design value to calculate capacitance accuracy (%), and an average value of 20 specimens was obtained.

As shown in FIG. 29, with the MIM capacitor of the present embodiment (examples 2 and 3), the accuracy of the measured value with respect to the design value of the electrostatic capacitance can be improved.

The present invention is not limited to the above embodiments, and various modifications can be made in the implementation stage without departing from the spirit thereof. In addition, the embodiments may be implemented in appropriate combination, and in that case, a combined effect can be obtained. Furthermore, the above-described embodiments include various inventions, and various inventions can be extracted by a combination selected from a plurality of disclosed constituent elements. For example, even if some components are deleted from all the components shown in the embodiment, if the problem can be solved and the effect can be obtained, the configuration from which the components are deleted can be extracted as the invention.

What is claimed is:

1. A wiring board, comprising:
a substrate having an insulating surface;
a first seed layer provided on the substrate;
a first conductive layer provided on the first seed layer;
a first insulating layer provided on the first conductive layer;
a second seed layer provided on the first insulating layer;
a second conductive layer provided on the second seed layer; and
a second insulating layer provided around the first seed layer, the first conductive layer, the first insulating layer, the second seed layer, and the second conductive layer, wherein
an area of the first insulating layer is smaller than an area of the first conductive layer,
an area of the second conductive layer is smaller than the area of the first insulating layer,
a region of the first insulating layer not overlapping the second conductive layer includes a first region surrounding the second conductive layer and a second region outside the first region, and
a surface roughness of the second region is larger than a surface roughness of the first region.

2. The wiring board according to claim 1, wherein a thickness of the second region is smaller than a thickness of the first region.

3. The wiring board according to claim 1, wherein a width of each of four corners of the second region is larger than a width of a linear portion of the second region.

4. The wiring board according to claim 1, wherein a ratio of a surface roughness of the second region to a surface roughness of the first region is 1.2 or more and 10 or less.

5. The wiring board according to claim 1, wherein a width of the second region is 1 μm or more and 10 μm or less.

6. The wiring board according to claim 1, wherein a surface roughness of a lower surface of the first insulating layer is smaller than a surface roughness of the second region.

7. The wiring board according to claim 1, wherein a side wall of the first insulating layer has a forward tapered shape.

8. The wiring board according to claim 1, wherein the first conductive layer includes a side etching portion provided under an end of the first insulating layer.

9. The wiring board according to claim 8, wherein a surface roughness of a region of the first conductive layer where the side etching portion is provided is larger than a surface roughness of a region other than the side etching portion.

10. The wiring board according to claim 8, wherein a ratio of a width to a height of the side etching portion is 0.03 or more and 50 or less.

11. The wiring board according to claim 8, wherein the second insulating layer includes one or more fillers provided in the side etching portion.

12. The wiring board according to claim 11, wherein a size of the filler is ½ or more of a height of the side etching portion.

* * * * *